US011521892B2

(12) United States Patent
Hsu

(10) Patent No.: US 11,521,892 B2
(45) Date of Patent: Dec. 6, 2022

(54) METHOD FOR FABRICATING A SEMICONDUCTOR DEVICE

(71) Applicant: NANYA TECHNOLOGY CORPORATION, New Taipei (TW)

(72) Inventor: Ping Hsu, New Taipei (TW)

(73) Assignee: NANYA TECHNOLOGY CORPORATION, New Taipei (TW)

(*) Notice: Subject to any disclaimer, the term of this patent is extended or adjusted under 35 U.S.C. 154(b) by 69 days.

(21) Appl. No.: 17/334,104

(22) Filed: May 28, 2021

(65) Prior Publication Data
US 2021/0288007 A1    Sep. 16, 2021

Related U.S. Application Data

(62) Division of application No. 16/573,549, filed on Sep. 17, 2019, now Pat. No. 11,101,229.

(51) Int. Cl.
H01L 21/762    (2006.01)
H01L 23/00     (2006.01)
H01L 23/48     (2006.01)
H01L 21/768    (2006.01)
H01L 29/06     (2006.01)
H01L 21/304    (2006.01)
(Continued)

(52) U.S. Cl.
CPC ...... H01L 21/76224 (2013.01); H01L 21/304 (2013.01); H01L 21/30625 (2013.01); H01L 21/76237 (2013.01); H01L 21/76852 (2013.01); H01L 21/76897 (2013.01); H01L 21/823481 (2013.01); H01L 23/481 (2013.01); H01L 24/03 (2013.01); H01L 24/05 (2013.01); H01L 29/0649 (2013.01); H01L 29/0653 (2013.01); H01L 2224/0391 (2013.01); H01L 2224/05025 (2013.01); H01L 2224/05083 (2013.01); H01L 2224/05116 (2013.01); H01L 2224/05124 (2013.01); H01L 2224/05139 (2013.01); H01L 2224/05144 (2013.01); H01L 2224/05147 (2013.01); H01L 2224/05155 (2013.01); H01L 2224/05169 (2013.01)

(58) Field of Classification Search
CPC ......... H01L 21/76224; H01L 21/76237; H01L 21/823481; H01L 21/30625; H01L 21/304; H01L 29/0649; H01L 29/0653; H01L 24/05
See application file for complete search history.

(56) References Cited

U.S. PATENT DOCUMENTS

2008/0121977 A1*  5/2008  Choi ............... H01L 29/7881
                                                257/E21.546
2010/0140776 A1   6/2010  Trezza
2010/0176445 A1   7/2010  Hsieh
(Continued)

Primary Examiner — Joseph C. Nicely
(74) Attorney, Agent, or Firm — Muncy, Geissler, Olds & Lowe, P.C.

(57) ABSTRACT

The present application discloses a method for fabricating a semiconductor device with liners. The method includes providing a substrate having a first surface and a second surface opposite to the first surface, inwardly forming a trench on the first surface of the substrate, forming a plurality of liners positioned on side surfaces of the trench, forming a first insulating segment filling the trench, and removing part of the substrate from the second surface to expose the first insulating segment and the plurality of liners.

8 Claims, 22 Drawing Sheets

(51) Int. Cl.
*H01L 21/306* (2006.01)
*H01L 21/8234* (2006.01)

(56) References Cited

U.S. PATENT DOCUMENTS

| | | |
|---|---|---|
| 2012/0034757 A1 | 2/2012 | Choi et al. |
| 2013/0099350 A1* | 4/2013 | Peng ................. H01L 21/02343 |
| | | 257/510 |
| 2014/0357050 A1* | 12/2014 | Feng ................. H01L 21/76229 |
| | | 438/430 |
| 2016/0035827 A1 | 2/2016 | Diaz et al. |
| 2017/0110454 A1 | 4/2017 | Chang et al. |
| 2018/0114847 A1 | 4/2018 | Alptekin |
| 2018/0315853 A1 | 11/2018 | Yu et al. |
| 2019/0131181 A1 | 5/2019 | Van Dal et al. |
| 2020/0227359 A1 | 7/2020 | Kang |

* cited by examiner

METHOD FOR FABRICATING A SEMICONDUCTOR DEVICE

CROSS-REFERENCE TO RELATED APPLICATION

This application is a divisional application of U.S. Non-Provisional application Ser. No. 16/573,549 filed Sep. 17, 2019, which is incorporated herein by reference in its entirety.

TECHNICAL FIELD

The present disclosure relates to a method for fabricating a semiconductor device, and more particularly, to a method for fabricating a semiconductor device with liners.

DISCUSSION OF THE BACKGROUND

Semiconductor devices are used in a variety of electronic applications, such as personal computers, cell phones, digital cameras, and other electronic equipment. The dimensions of semiconductor devices are continuously being scaled down to meet the increasing demand of computing ability. However, a variety of issues arise during the scaling down process and impact the final electrical characteristics, quality, and yield. Therefore, challenges remain in achieving improved quality, yield, performance, and reliability.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a semiconductor device including a first conductive body, a second conductive body positioned separate from the first conductive body, a plurality of liners respectively correspondingly attached to a side surface of the first conductive body and a side surface of the second conductive body, and a first insulating segment positioned between the first conductive body and the second conductive body.

In some embodiments, the semiconductor device further comprises a first doped region positioned in a top surface of the first conductive body and the side surface of the first conductive body.

In some embodiments, the first insulating segment comprises an embedding portion and an extension portion, the embedding portion is positioned between the plurality of liners, and the extension portion is positioned on the embedding portion.

In some embodiments, two sides of the extension portion are respectively correspondingly positioned on a portion of a top surface of the first conductive body and a portion of a top surface of the second conductive body.

In some embodiments, a width of the extension portion is greater than or equal to a horizontal distance between the first conductive body and the second conductive body.

In some embodiments, the semiconductor device further comprises a first conductive pad and a second conductive pad, wherein the first conductive pad is positioned on the top surface of the first conductive body and the second conductive pad is positioned on the top surface of the second conductive body.

In some embodiments, the first conductive pad comprises a first bottom conductive layer and a first middle conductive layer, the first bottom conductive layer is positioned on the top surface of the first conductive body, and the first middle conductive layer is positioned on the first bottom conductive layer.

In some embodiments, the first conductive pad comprises a first bottom conductive layer, a first middle conductive layer, and a first top conductive layer, the first bottom conductive layer is positioned on the top surface of the first conductive body, the first middle conductive layer is positioned on the first bottom conductive layer, and the first top conductive layer is positioned on the first middle conductive layer.

In some embodiments, one side of the first bottom conductive layer covers a portion of a top surface of the extension portion.

In some embodiments, the first conductive pad is formed of aluminum, silver, platinum, lead, nickel, gold, copper, or alloys thereof.

In some embodiments, a horizontal distance between the first conductive pad and the second conductive pad is less than the width of the extension portion.

In some embodiments, the semiconductor device further comprises a first passivation segment positioned between the first conductive pad and the second conductive pad.

Another aspect of the present disclosure provides a method for fabricating a semiconductor device including providing a substrate having a first surface and a second surface opposite to the first surface, inwardly forming a trench on the first surface of the substrate, forming a plurality of liners positioned on side surfaces of the trench, forming a first insulating segment filling the trench, and removing part of the substrate from the second surface to expose the first insulating segment and the plurality of liners.

In some embodiments, the method for fabricating the semiconductor device further comprises forming a doped region in the substrate, wherein the doped region is positioned in the first surface of the substrate, the side surfaces of the trench, and a bottom of the trench.

In some embodiments, the plurality of liners are formed of titanium, titanium nitride, titanium-tungsten alloy, tantalum, tantalum nitride, or a combination thereof.

In some embodiments, the first insulating segment comprises an embedding portion and an extension portion, the embedding portion is positioned in the trench and covers the plurality of liners, and the extension portion is positioned on the embedding portion.

In some embodiments, the extension portion further cover a portion of the first surface of the substrate.

In some embodiments, the method for fabricating the semiconductor device further comprises forming a first conductive pad and a second conductive pad above the substrate.

In some embodiments, the first conductive pad comprises a first bottom conductive layer positioned on the substrate, a first middle conductive layer positioned on the first bottom conductive layer, and a first top conductive layer positioned on the first middle conductive layer.

In some embodiments, the method for fabricating the semiconductor device further comprises forming a first passivation segment positioned between the first conductive pad and the second conductive pad.

Due to the design of the semiconductor device of the present to disclosure, the equivalent series resistance and an equivalent series inductance of the semiconductor device may be reduced; thus, the performance of the semiconductor device may be improved.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
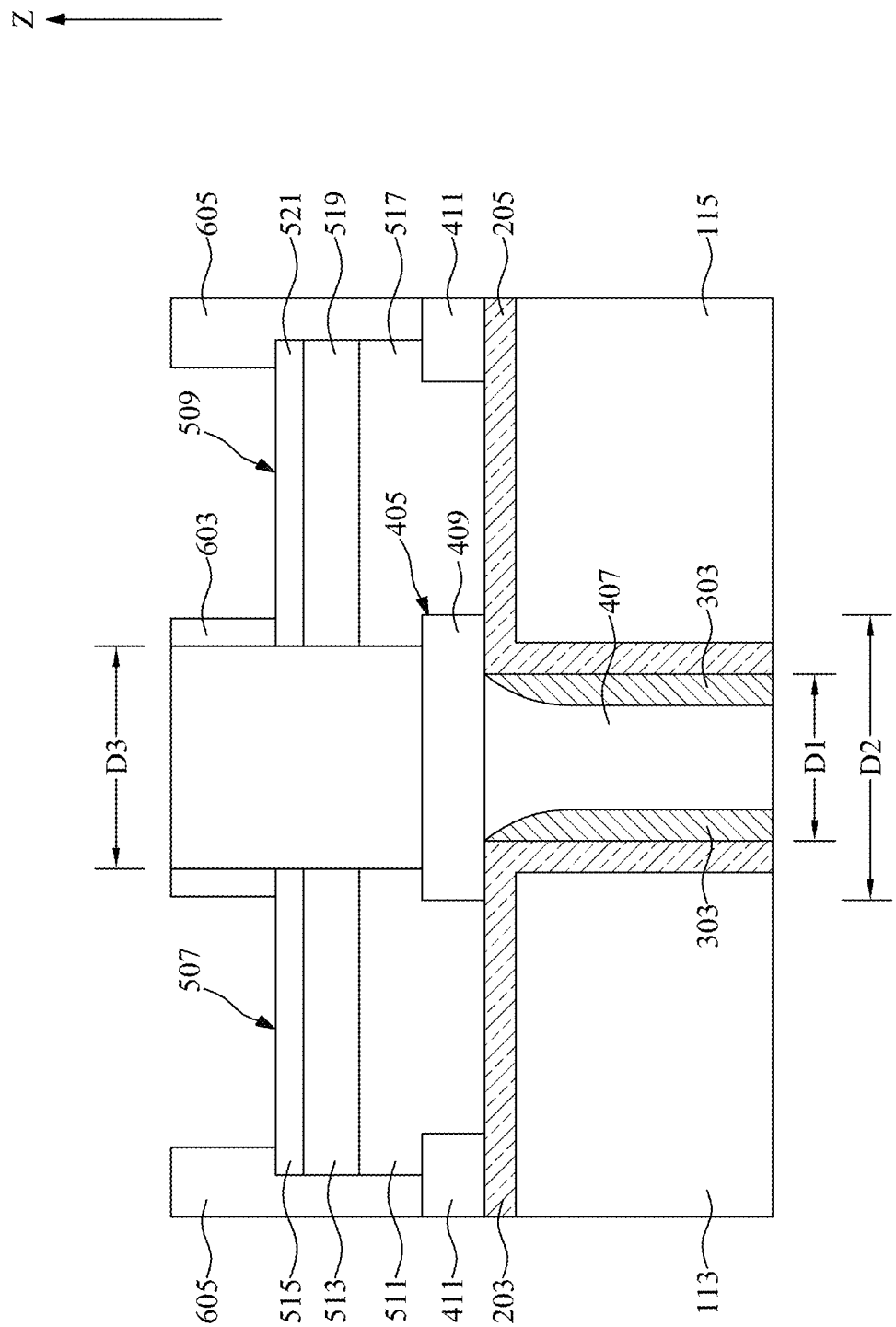
FIG. 1 illustrates, in a schematic cross-sectional view diagram, a semiconductor device in accordance with one embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It will be understood that when an element or layer is referred to as being "connected to" or "coupled to" another element or layer, it can be directly connected to or coupled to another element or layer or intervening elements or layers may be present.

It will be understood that, although the terms first, second, etc. may be used herein to describe various elements, these elements should not be limited by these terms. Unless indicated otherwise, these terms are only used to distinguish one element from another element. Thus, for example, a first element, a first component or a first section discussed below could be termed a second element, a second component or a second section without departing from the teachings of the present disclosure.

Unless the context indicates otherwise, terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning. For example, items described as "substantially the same," "substantially equal," or "substantially planar," may be exactly the same, equal, or planar, or may be the same, equal, or planar within acceptable variations that may occur, for example, due to manufacturing processes.

In the present disclosure, a semiconductor device generally means a device which can function by utilizing semiconductor characteristics, and an electro-optic device, a light-emitting display device, a capacitor component, a semiconductor circuit, and an electronic device are all included in the category of the semiconductor device.

It should be noted that, in the description of the present disclosure, above (or up) corresponds to the direction of the arrow of the direction Z, and below (or down) corresponds to the opposite direction of the arrow of the direction Z.

FIG. 1 illustrates, in a schematic cross-sectional view diagram, a semiconductor device in accordance with one embodiment of the present disclosure.

With reference to FIG. 1, in the embodiment depicted, a semiconductor device may include a first conductive body 113, a second conductive body 115, a first doped region 203, a second doped region 205, a plurality of liners 303, a first insulating segment 405, second insulating segments 411, a first conductive pad 507, a second conductive pad 509, a first passivation segment 603, and second passivation segments 605.

With reference to FIG. 1, in the embodiment depicted, the first conductive body 113 and the second conductive body 115 may be disposed separate from each other. The first conductive body 113 may include a top surface, a side surface, and a bottom surface. The second conductive body 115 may include a top surface, a side surface, and a bottom surface. The top surface of the first conductive body 113 and the side surface of the first conductive body 113 may be joined and perpendicular to each other, but are not limited thereto. The top surface of the first conductive body 113 and the bottom surface of the first conductive body 113 may be parallel to each other, but are not limited thereto. The bottom surface of the first conductive body 113 and the side surface of the first conductive body 113 may be joined and perpendicular to each other, but are not limited thereto.

With reference to FIG. 1, in the embodiment depicted, the top surface of the second conductive body 115 and the side surface of the second conductive body 115 may be joined and perpendicular to each other, but are not limited thereto. The top surface of the second conductive body 115 and the bottom surface of the second conductive body 115 may be parallel to each other, but are not limited thereto. The bottom surface of the second conductive body 115 and the side surface of the second conductive body 115 may be joined and perpendicular to each other, but are not limited thereto. The side surface of the first conductive body 113 may face toward the side surface of the second conductive body 115. Specifically, a horizontal distance D1 between the side surface of the first conductive body 113 and the side surface of the second conductive body 115 may be between about 0.02 mm and about 0.2 mm. Alternatively, in another embodiment, the horizontal distance D1 may be between about 200 nm and about 2000 nm.

With reference to FIG. 1, in the embodiment depicted, the first conductive body 113 and the second conductive body 115 may be formed of, for example, silicon including single crystalline silicon or polycrystalline silicon, doped silicon, germanium, doped germanium, silicon germanium, doped silicon germanium, silicon carbon, doped silicon carbon, silicon germanium carbon, doped silicon germanium carbon, gallium, doped gallium, gallium arsenic, indium arsenic, indium phosphorus or other IV-IV, III-V or II-VI semiconductor materials. In the embodiment depicted, the first conductive body 113 and the second conductive body 115 are both formed of single crystalline silicon. The first conductive body 113 and the second conductive body 115 are preferably formed of the same material, but are not limited thereto. The first conductive body 113 and the second conductive body 115 may respectively have a resistivity R1, R2. The resistivity R1 of the first conductive body 113 and the resistivity R2 of the second conductive body 115 may be the same, but are not limited thereto. Specifically, the resistivity R1 of the first conductive body 113 and the resistivity R2 of the second conductive body 115 may be less than 1.0E-3 Ω·cm.

With reference to FIG. 1, in the embodiment depicted, the first doped region 203 may be disposed in the first conductive body 113. Specifically, the first doped region 203 may be disposed in the top surface of the first conductive body 113 and the side surface of the first conductive body 113. A resistivity R3 of the first doped region 203 may be less than the resistivity R1 of the first conductive body 113. Specifically, the first doped region 203 may be doped with a dopant such as phosphorus, arsenic, or antimony. A dopant concentration of the first doped region 203 may be about 1.0E20 ions/cm^3. The resistivity R3 of the first doped region 203 may be less than 0.9E-3 Ω·cm. The first doped region 203 may reduce the resistivity of the first conductive body 113 along the top surface of the first conductive body 113 and the side surface of the first conductive body 113.

With reference to FIG. 1, in the embodiment depicted, the second doped region 205 may be disposed in the second conductive body 115. Specifically, the second doped region 205 may be disposed in the top surface of the second conductive body 115 and the side surface of the second conductive body 115. A resistivity R4 of the second doped region 205 may be less than the resistivity R2 of the second conductive body 115. Specifically, the second doped region 205 may be doped with a dopant such as phosphorus, arsenic, or antimony. A dopant concentration of the second doped region 205 may be about 1.0E20 ions/cm^3. The resistivity R4 of the second doped region 205 may be less than 0.9E-3 Ω·cm. The second doped region 205 may be doped with the same dopant as the dopant of the first doped region 203, but is not limited thereto. The resistivity R4 of the second doped region 205 may be the same as the resistivity R3 of the first doped region 203, but is not limited thereto. The second doped region 205 may reduce the resistivity of the second conductive body 115 along the top surface of the second conductive body 115 and the side surface of the second conductive body 115. The low resistivity of the first doped region 203 and the second doped region 205 may respectively compensate for the reduction of conductive area in the first conductive body 113 and the second conductive body 115 induced by the skin effect when an AC power is applied to the semiconductor device. Therefore, the first doped region 203 and the second doped region 205 may decrease an equivalent series resistance of the semiconductor device and improve the performance of the semiconductor device.

With reference to FIG. 1, in the embodiment depicted, the plurality of liners 303 may be respectively correspondingly attached to the side surface of the first conductive body 113 and the side surface of the second conductive body 115. In other words, the plurality of liners 303 may be respectively correspondingly disposed adjacent to and connected to the first doped region 203 in the side surface of the first conductive body 113 and the second doped region 205 in the side surface of the second conductive body 115. Thicknesses of the plurality of liners 303 may be between about 1.0 μm and about 10 μm. Alternatively, in another embodiment, the thicknesses of the plurality of liners 303 may be between about 10 nm and about 100 nm. The plurality of liners 303 may be formed of, for example, titanium, titanium nitride, titanium-tungsten alloy, tantalum, tantalum nitride, or a combination thereof. The plurality of liners 303 may have a resistivity R5 less than the resistivity R1 of the first conductive body 113 or the resistivity R2 of the second conductive body 115. The resistivity R5 of the plurality of liners 303 may be equal to or less than the resistivity R3 of the first doped region 203 or the resistivity R4 of the second doped region 205. The plurality of liners 303 may decrease the equivalent series resistance of the semiconductor device and improve the performance of the semiconductor device. In addition, the presence of the plurality of liners 303 may make a space between the first conductive body 113 and the second conductive body 115 thinner; hence, a capacitance of the semiconductor device may be increased. Thus, the performance of the semiconductor device may be improved.

With reference to FIG. 1, in the embodiment depicted, the first insulating segment 405 may be disposed between the first conductive body 113 and the second conductive body 115. The first insulating segment 405 may include an embedding portion 407 and an extension portion 409. The embedding portion 407 may be disposed between the first conductive body 113 and the second conductive body 115. Specifically, the embedding portion 407 is disposed between the side surface of the first conductive body 113 and the side surface of the second conductive body 115. Two sides of the embedding portion 407 are directly connected to the plurality of liners 303. The embedding portion 407 may cover the plurality of liners 303.

With reference to FIG. 1, in the embodiment depicted, the extension portion 409 may be disposed on the embedding portion 407, the first conductive body 113, and the second conductive body 115. A width D2 of the extension portion 409 may be greater than the horizontal distance D1 between the side surface of the first conductive body 113 and the side surface of the second conductive body 115. Specifically, two sides of a bottom of the extension portion 409 are respectively disposed on the top surface of the first conductive body 113 and the top surface of the second conductive body 115. The embedding portion 407 and the extension portion 409 may be formed of silicon nitride, silicon oxide, silicon oxynitride, flowable oxide, tonen silazen, undoped silica glass, borosilica glass, phosphosilica glass, borophosphosilica glass, plasma-enhanced tetra-ethyl orthosilicate, fluoride silicate glass, carbon-doped silicon oxide, xerogel, aerogel, amorphous fluorinated carbon, organo silicate glass, parylene, bis-benzocyclobutenes, polyimide, porous polymeric material, or a combination thereof, but are not limited thereto. Preferably, the embedding portion 407 and the extension portion 409 may be formed of the same material, but are not limited thereto.

With reference to FIG. 1, in the embodiment depicted, the second insulating segments 411 may be respectively correspondingly disposed on the top surface of the first conductive body 113 and the top surface of the second conductive body 115. The second insulating segments 411 may be disposed at a same vertical level as the extension portion 409. The second insulating segments 411 may be respectively correspondingly distanced from the extension portion 409. The second insulating segments 411 may be formed of the same material as the extension portion 409.

With reference to FIG. 1, in the embodiment depicted, the first conductive pad 507 may be disposed on the top surface of the first conductive body 113. The first conductive pad 507 may include a first bottom conductive layer 511, a first middle conductive layer 513, and a first top conductive layer 515. The first bottom conductive layer 511 may be disposed on the top surface of the first conductive body 113. Two sides of the first bottom conductive layer 511 may respectively correspondingly cover a portion of one of the second insulating segments 411 disposed on the top surface of the first conductive body 113 and a portion of the extension portion 409 disposed on the top surface of the first conductive body 113. The first bottom conductive layer 511 may be electrically coupled to the first doped region 203 and the first conductive body 113.

With reference to FIG. 1, in the embodiment depicted, the first middle conductive layer 513 may be disposed on the first bottom conductive layer 511. The first middle conductive layer 513 may be electrically connected to the first bottom conductive layer 511. The first top conductive layer 515 may be disposed on the first middle conductive layer 513. The first top conductive layer 515 may be electrically connected to the first middle conductive layer 513. The first bottom conductive layer 511, the first middle conductive layer 513, and the first top conductive layer 515 may be formed of, for example, aluminum, silver, platinum, lead, nickel, gold, copper, alloys thereof, or the like. In the embodiment depicted, the first bottom conductive layer 511 is formed of aluminum, the first middle conductive layer 513 is formed of nickel, and the first top conductive layer 515 is formed of gold. The first bottom conductive layer 511 formed of aluminum may reduce a total resistivity of the first conductive pad 507. The first middle conductive layer 513 formed of nickel may enhance a bonding strength between the first conductive pad 507 and a solder. The first top conductive layer 515 formed of gold may prevent the first middle conductive layer 513 from oxidizing.

With reference to FIG. 1, in the embodiment depicted, the second conductive pad 509 may be disposed on the top surface of the second conductive body 115. The second conductive pad 509 may include a second bottom conductive layer 517, a second middle conductive layer 519, and a second top conductive layer 521. The second bottom conductive layer 517 may be disposed on the top surface of the second conductive body 115. Two sides of the second bottom conductive layer 517 may respectively correspondingly cover a portion of another one of the second insulating segments 411 disposed on the top surface of the second conductive body 115 and a portion of the extension portion 409 disposed on the top surface of the second conductive body 115. The second bottom conductive layer 517 may be electrically coupled to the second doped region 205 and the second conductive body 115.

With reference to FIG. 1, in the embodiment depicted, the second middle conductive layer 519 may be disposed on the second bottom conductive layer 517. The second middle conductive layer 519 may be electrically connected to the second bottom conductive layer 517. The second top conductive layer 521 may be disposed on the second middle conductive layer 519. The second top conductive layer 521 may be electrically connected to the second middle conductive layer 519. The second bottom conductive layer 517, the second middle conductive layer 519, and the second top conductive layer 521 may be formed of, for example, aluminum, silver, platinum, lead, nickel, gold, copper, alloys thereof, or the like. In the embodiment depicted, the second bottom conductive layer 517 is formed of aluminum, the second middle conductive layer 519 is formed of nickel, and the second top conductive layer 521 is formed of gold. The second bottom conductive layer 517 formed of aluminum may reduce a total resistivity of the second conductive pad 509. The second middle conductive layer 519 formed of nickel may enhance a bonding strength between the second conductive pad 509 and a solder. The second top conductive layer 521 formed of gold may prevent the second middle conductive layer 519 from oxidizing. A horizontal distance D3 between the first conductive pad 507 and the second conductive pad 509 may be greater than the horizontal distance D1 and less than the width D2 of the extension portion 409. The first bottom conductive layer 511 covering the portion of the extension portion 409 disposed on the top surface of the first conductive body 113 and the second bottom conductive layer 517 covering the portion of the extension portion 409 disposed on the top surface of the second conductive body 115 may minimize the horizontal distance D3 between the first conductive pad 507 and the second conductive pad 509, and thus it may possible to minimize a current pass. Therefore, the equivalent series resistance of the semiconductor device and an equivalent series inductance of the semiconductor device may be reduced.

With reference to FIG. 1, in the embodiment depicted, the first passivation segment 603 may be disposed on the first insulating segment 405. The first passivation segment 603 may be disposed between the first conductive pad 507 and the second conductive pad 509. Two sides of the first passivation segment 603 may respectively correspondingly cover a portion of a top surface of the first top conductive layer 515 and a portion of a top surface of the second top conductive layer 521. The first passivation segment 603 may be formed of, for example, benzocyclobutene, polyimide, silicon oxide, silicon nitride, phosphosilica glass, or the like.

With reference to FIG. 1, in the embodiment depicted, the second passivation segments 605 may be respectively correspondingly disposed on the second insulating segments 411. The second passivation segments 605 may be respectively distanced from the first passivation segment 603. The second passivation segments 605 may respectively correspondingly cover another portion of the top surface of the first top conductive layer 515 and another portion of the top surface of the second top conductive layer 521. The top surface of the first top conductive layer 515 and the top surface of the second top conductive layer 521 may be respectively exposed through spaces between the second passivation segments 605 and the first passivation segment 603. The second passivation segments 605 are preferably formed of the same material as the first passivation segment 603, but are not limited thereto. The first passivation segment 603 and the second passivation segments 605 may protect the first conductive body 113, the second conductive body 115, the first conductive pad 507, and the second conductive pad 509 from effects of external moisture.

Figure 2:
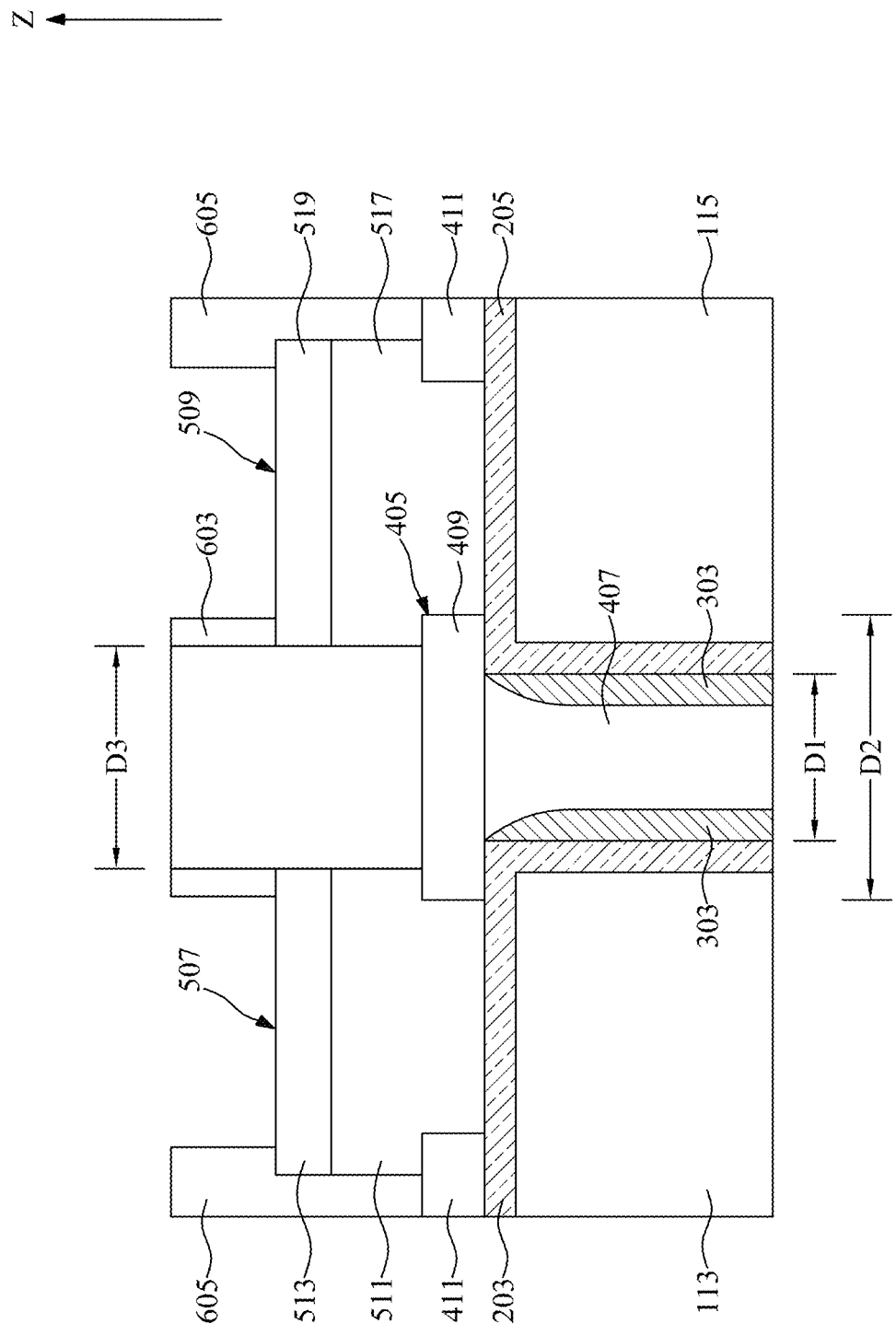
FIG. 2 illustrates, in a schematic cross-sectional view diagram, a semiconductor device in accordance with another embodiment of the present disclosure.

FIG. 2 illustrates, in a schematic cross-sectional view diagram, a semiconductor device in accordance with another embodiment of the present disclosure.

With reference to FIG. 2, in another embodiment, the first conductive pad 507 may include a first bottom conductive layer 511 and a first middle conductive layer 513. The first bottom conductive layer 511 may be disposed on the top surface of the first conductive body 113. Two sides of the first bottom conductive layer 511 may respectively correspondingly cover a portion of one of the second insulating segments 411 disposed on the top surface of the first conductive body 113 and a portion of the extension portion 409 disposed on the top surface of the first conductive body 113. The first bottom conductive layer 511 may be electrically coupled to the first doped region 203 and the first conductive body 113. The first middle conductive layer 513 may be disposed on the first bottom conductive layer 511.

With reference to FIG. 2, in another embodiment, the second conductive pad 509 may include a second bottom conductive layer 517 and a second middle conductive layer 519. The second bottom conductive layer 517 may be disposed on the top surface of the second conductive body 115. Two sides of the second bottom conductive layer 517 may respectively correspondingly cover a portion of another one of the second insulating segments 411 disposed on the top surface of the second conductive body 115 and a portion of the extension portion 409 disposed on the top surface of the second conductive body 115. The second bottom conductive layer 517 may be electrically coupled to the second doped region 205 and the second conductive body 115. The second middle conductive layer 519 may be disposed on the second bottom conductive layer 517.

Figure 3:
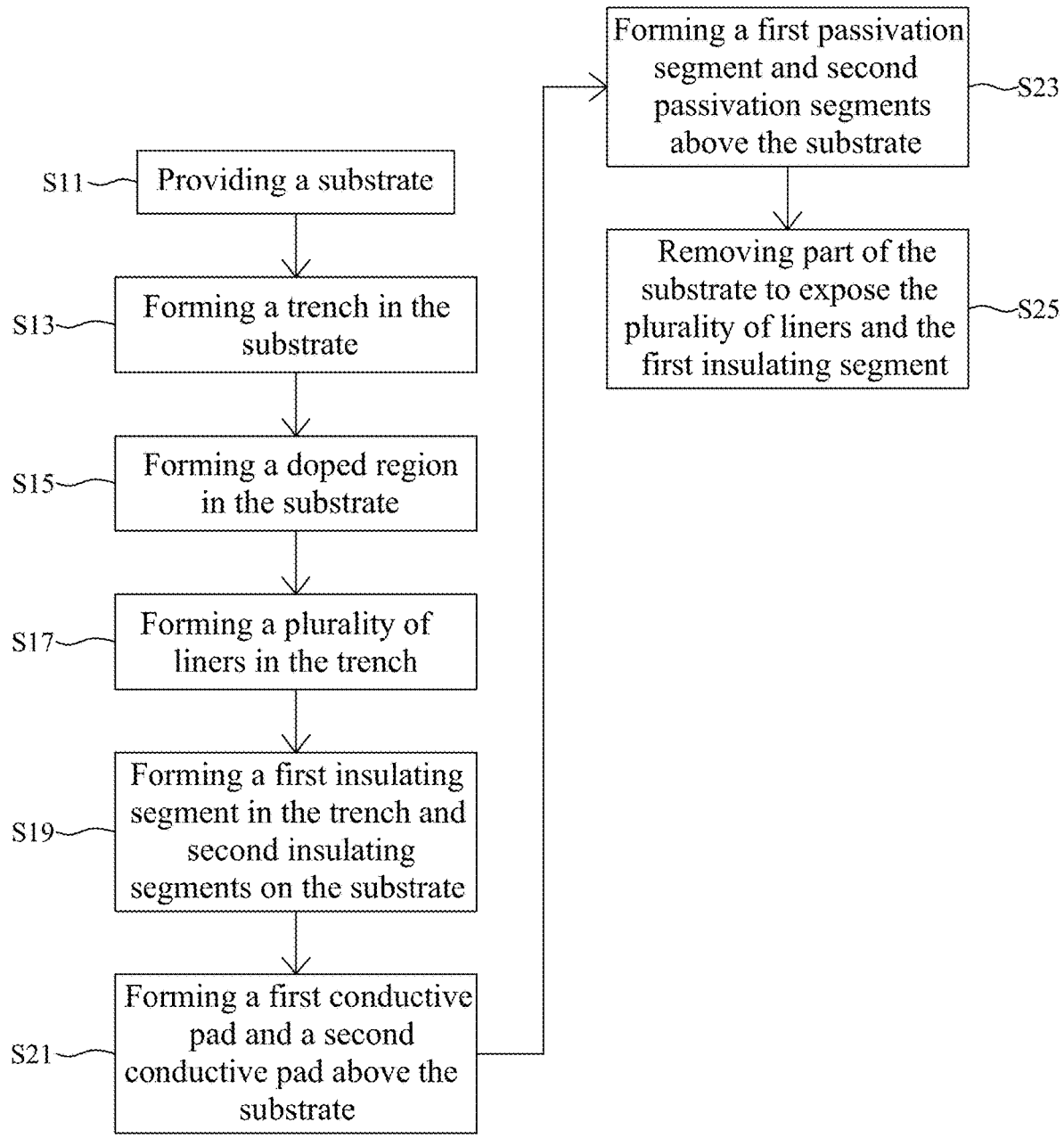
FIG. 3 illustrates, in a flowchart diagram form, a method for fabricating a semiconductor device in accordance with one embodiment of the present disclosure.

FIG. 3 illustrates, in flowchart diagram form, a method 10 for fabricating a semiconductor device in accordance with one embodiment of the present disclosure. FIGS. 4 to 22 illustrate, in schematic cross-sectional diagrams, a flow of fabricating a semiconductor device in accordance with one embodiment of the present disclosure.

Figure 4:
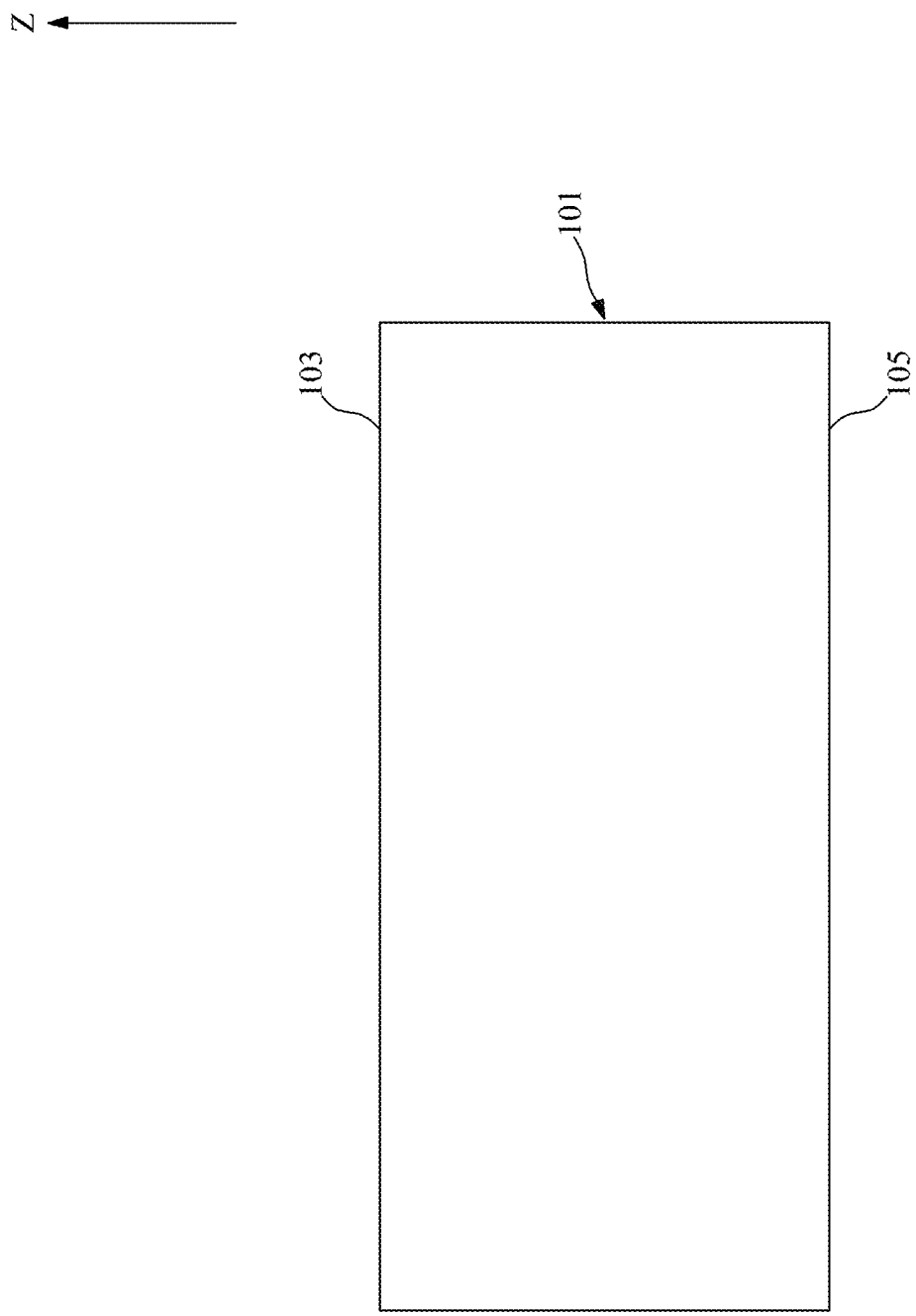
FIGS. 4 to 22 illustrate, in schematic cross-sectional diagrams, a flow of fabricating a semiconductor device in accordance with one embodiment of the present disclosure.

With reference to FIG. 3 and FIG. 4, at step S11, in the embodiment depicted, a substrate 101 may be provided. The substrate 101 may include a first surface 103 and a second surface 105. In the embodiment depicted, the first surface 103 of the substrate 101 faces upward and is parallel to the second surface 105. The second surface 105 of the substrate 101 faces downward and is opposite to the first surface 103 of the substrate 101.

Figure 5:
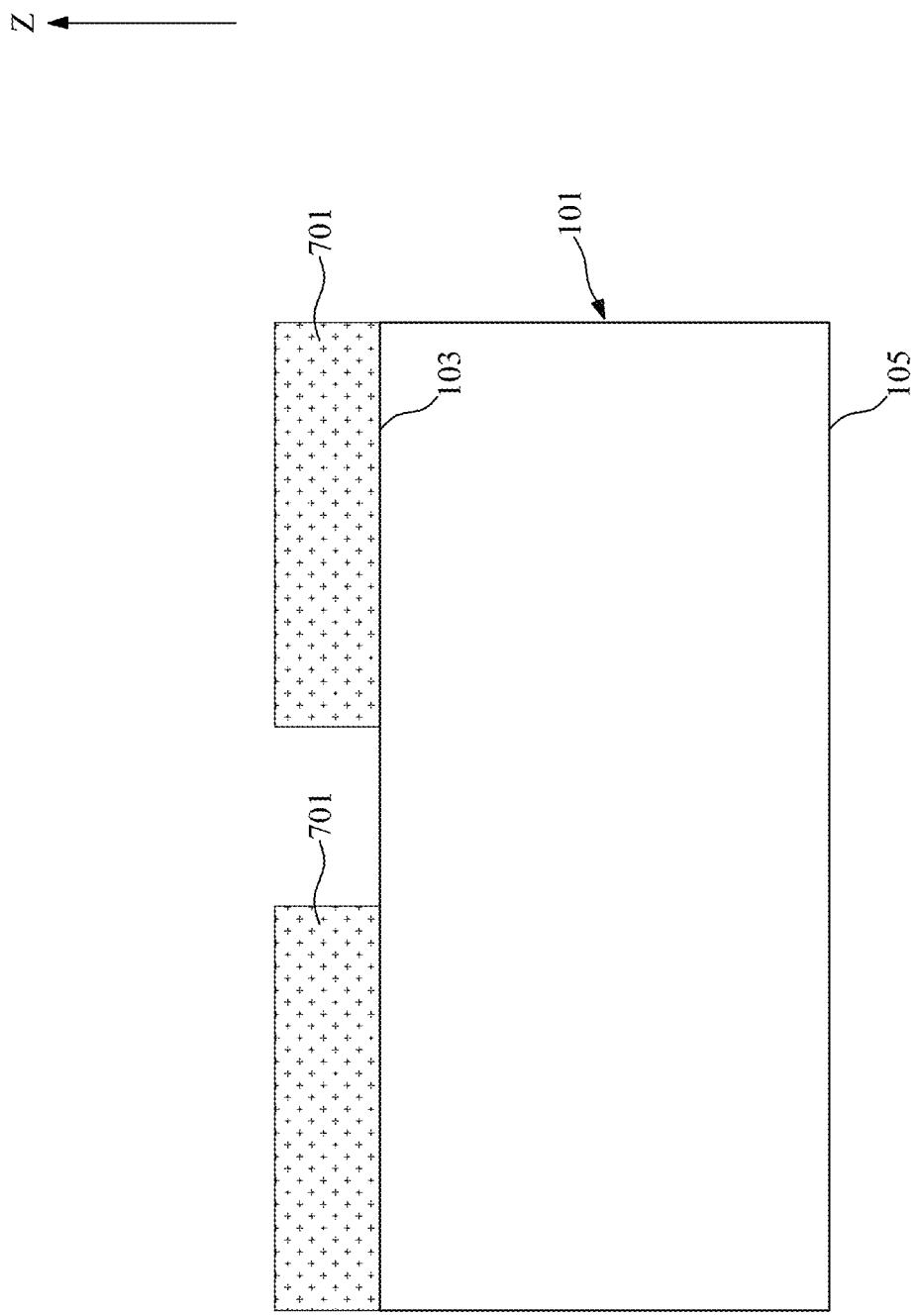
Figure 6:
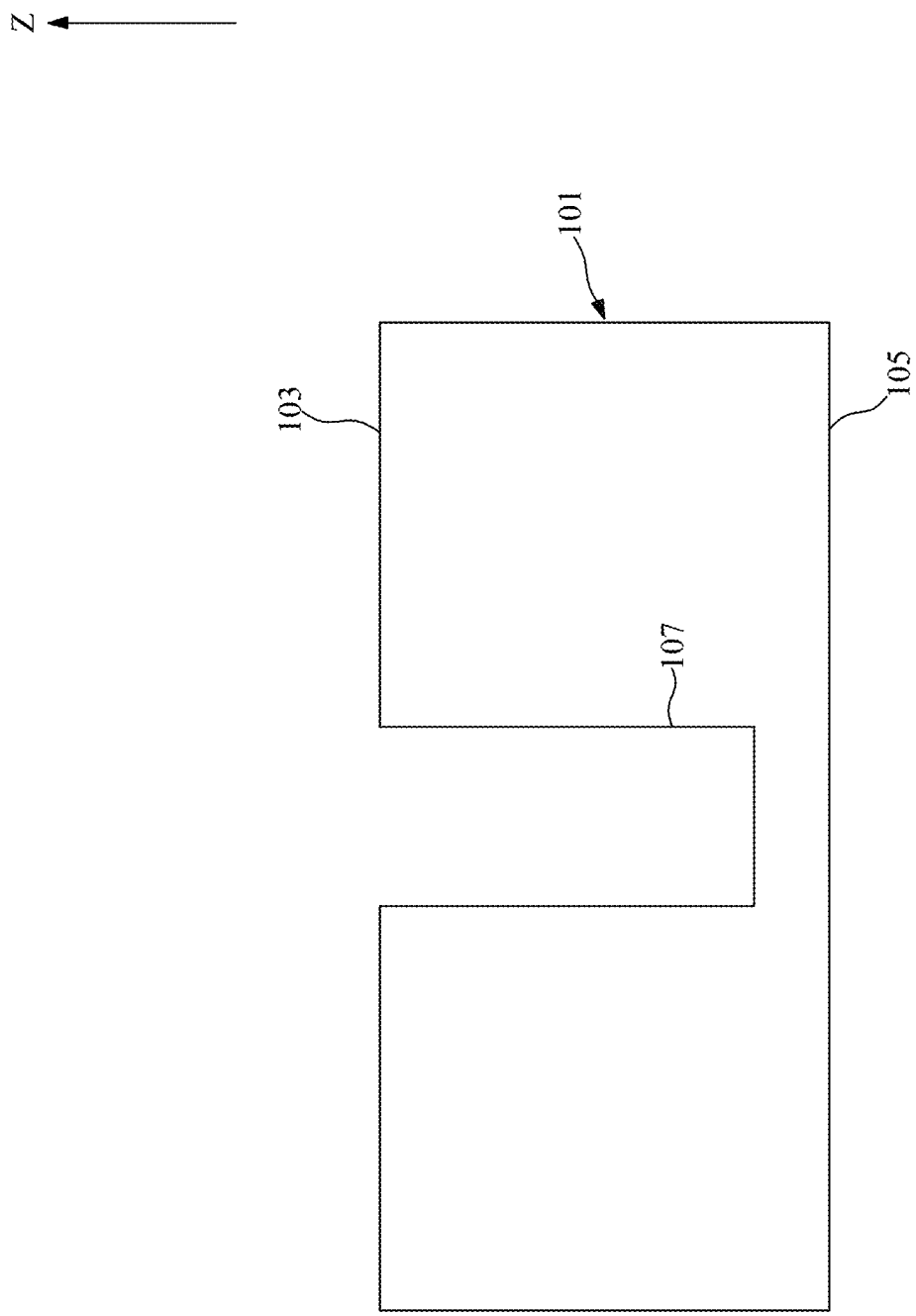

With reference to FIG. 3 and FIGS. 5 to 6, at step S13, in the embodiment depicted, a trench 107 may be formed in the substrate 101. The trench 107 may be formed inwardly in the substrate 101 with an opening on the first surface 103 of the substrate 101. With reference to FIG. 5, a photolithography process may be performed by developing a first mask layer 701 on the first surface 103 of the substrate 101 to define a position of the trench 107 on the first surface 103 of the substrate 101. With reference to FIG. 6, an etch process, such as an anisotropic dry etch process, may be performed after the photolithography process to form the trench 107 in the substrate 101.

Figure 7:
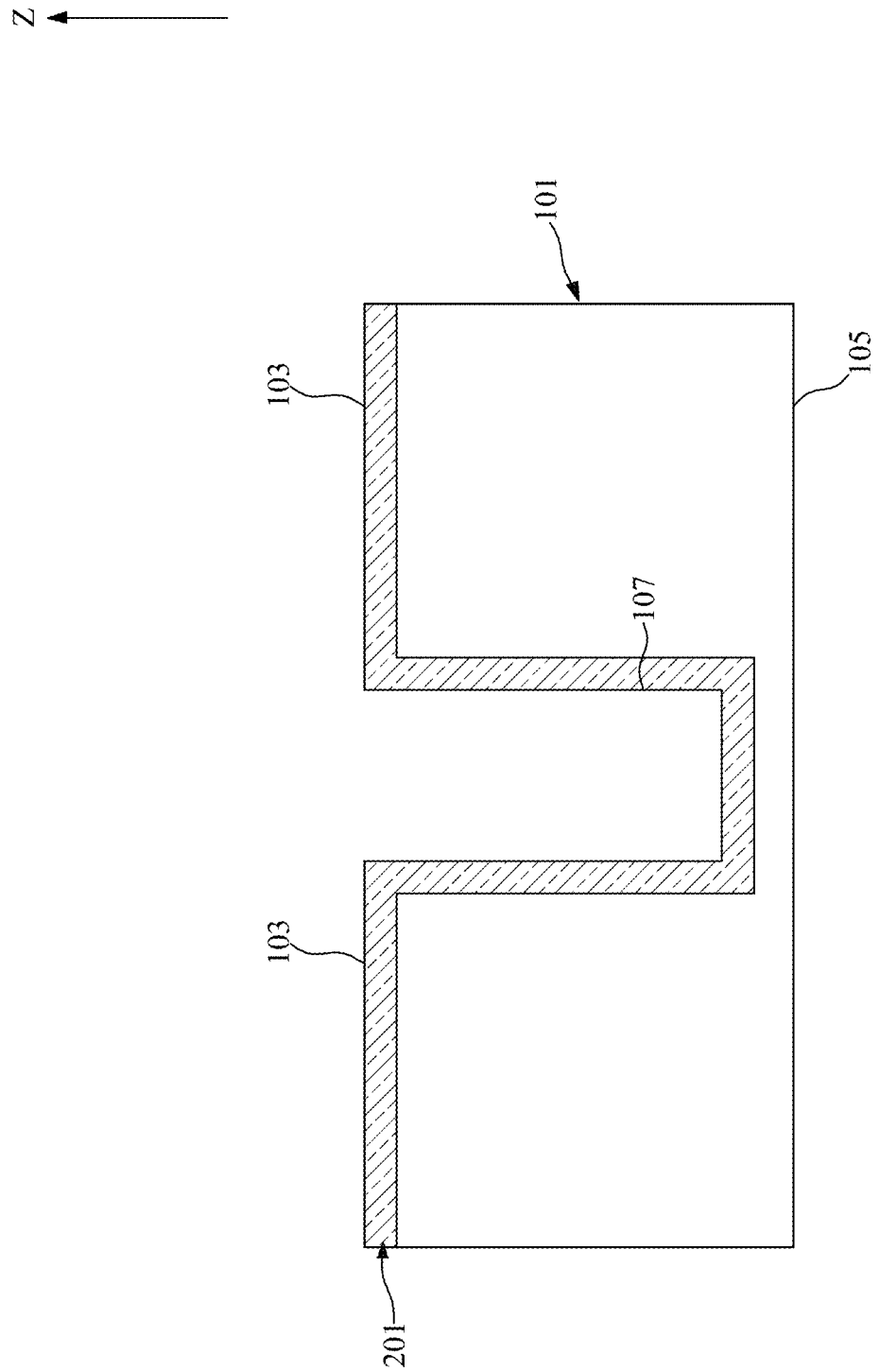

With reference to FIG. 3 and FIG. 7, at step S15, in the embodiment depicted, a doped region 201 may be formed in the substrate 101. An implantation process may be performed from above the first surface 103 of the substrate 101 to form the doped region 201 in the substrate 101. The doped region 201 may be disposed in the first surface 103 of the substrate 101, side surfaces of the trench 107, and a bottom of the trench 107. A resistivity of the doped region 201 may be less than or equal to a resistivity of the substrate 101.

Figure 8:
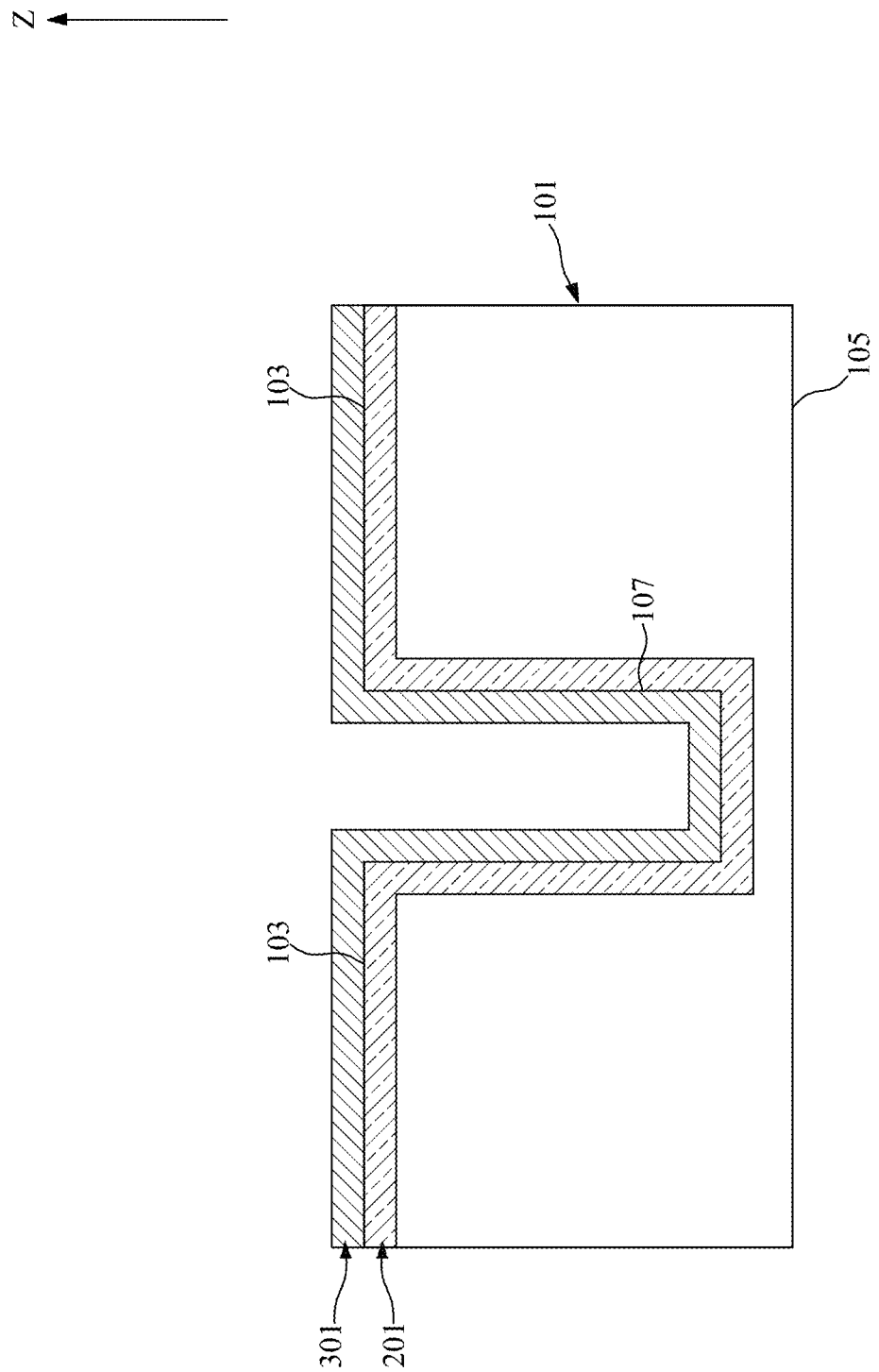
Figure 9:
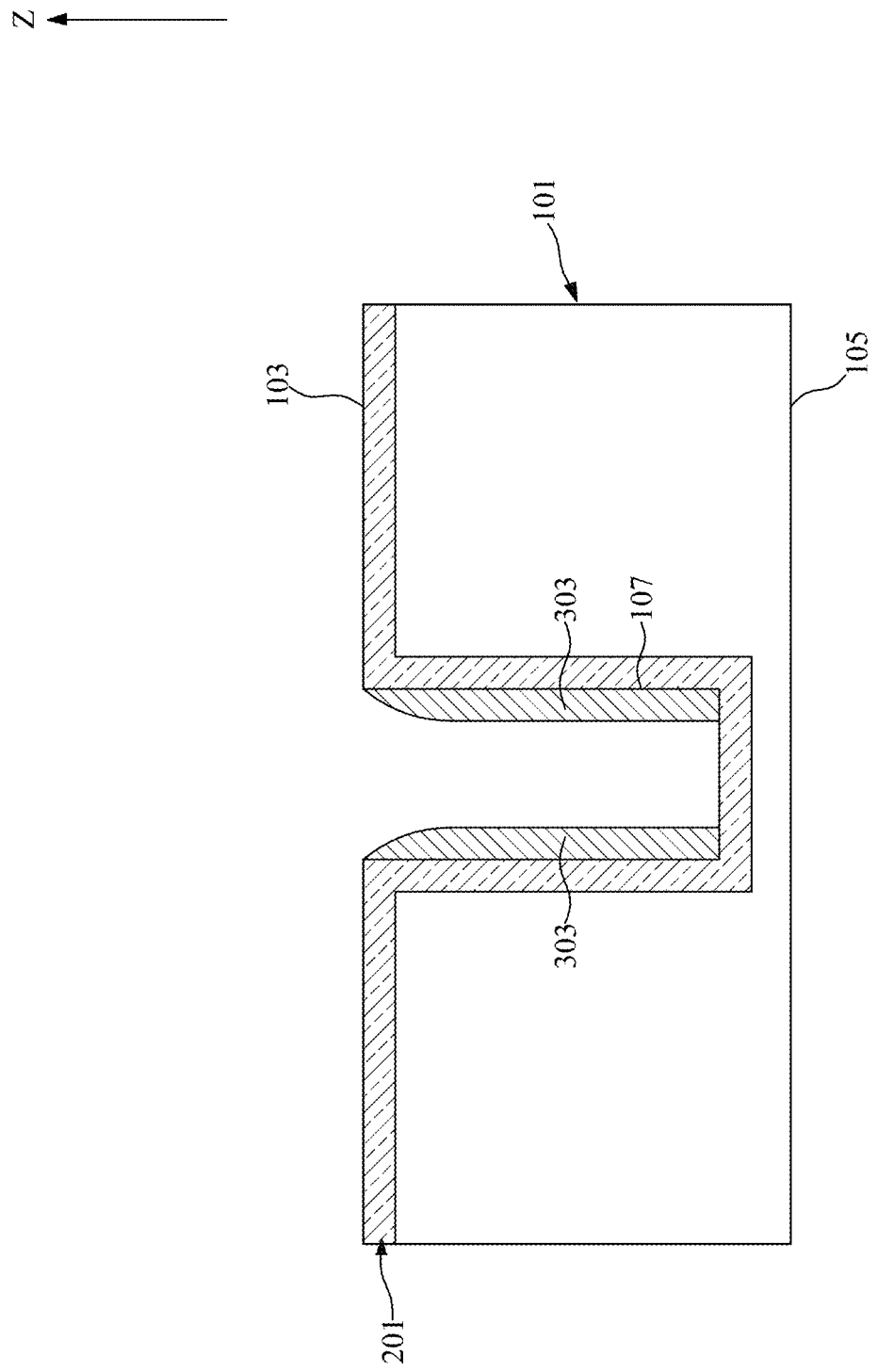

With reference to FIG. 3 and FIGS. 8 to 9, at step S17, in the embodiment depicted, a plurality of liners 303 may be formed in the trench 107. With reference to FIG. 8, a liner layer 301 may be deposited on the first surface 103 of the substrate 101, the side surfaces of the trench 107, and the bottom of the trench 107. The liner layer 301 may be formed of, for example, titanium, titanium nitride, titanium-tungsten alloy, tantalum, tantalum nitride, or a combination thereof. With reference to FIG. 9, an etch process, such as an anisotropic dry etch process, may be performed to form the plurality of liners 303 attached to the side surfaces of the trench 107. The plurality of liners 303 may be electrically connected to the doped region 201.

Figure 10:
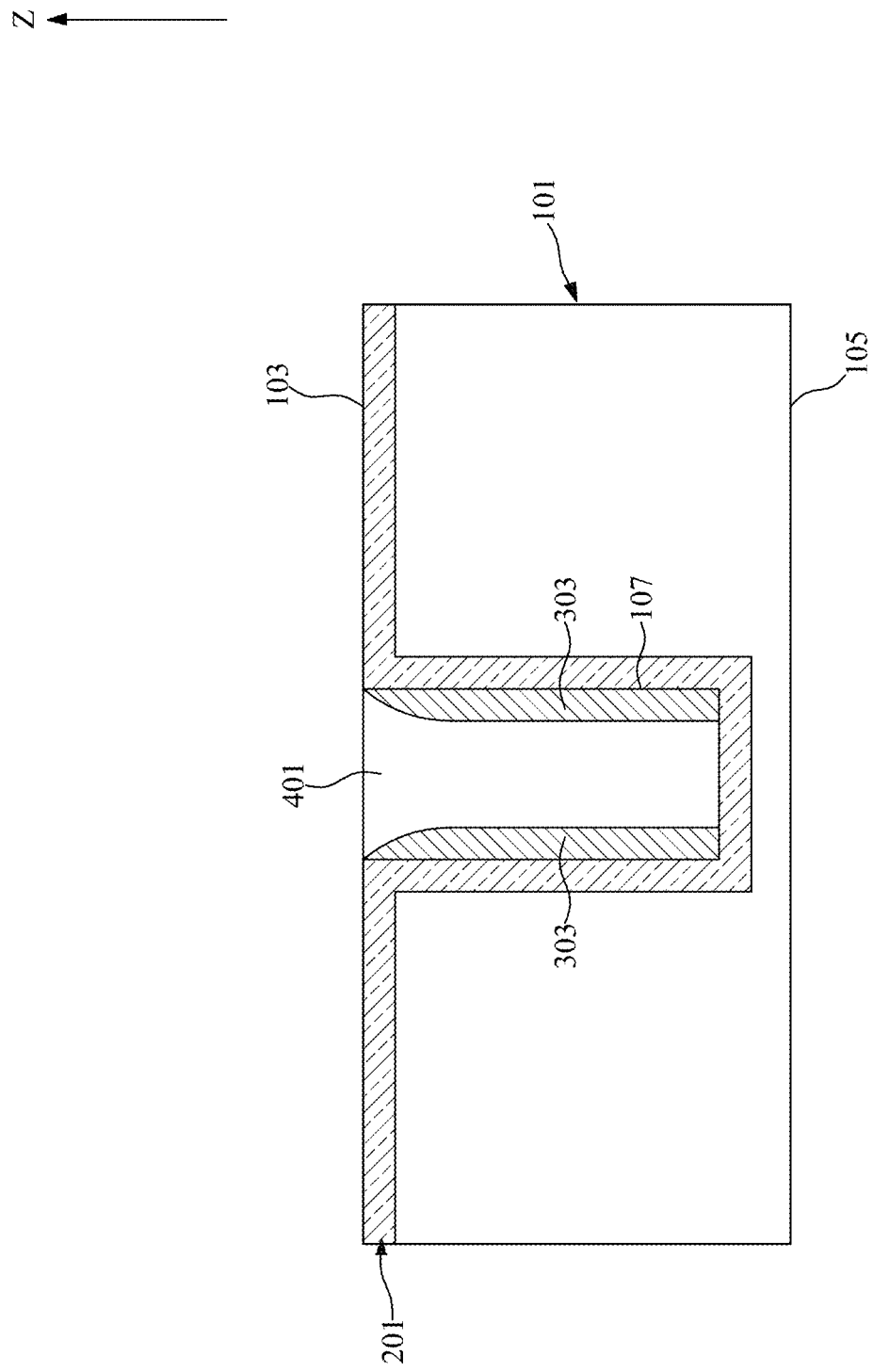

With reference to FIG. 3 and FIGS. 10 to 13, at step S19, in the embodiment depicted, a first insulating segment 405 may be formed in the trench 107 and on the substrate 101 and second insulating segments 411 may be formed on the first surface 103 of the substrate 101. With reference to FIG. 10, a deposition process may be performed to deposit a first insulating layer 401 in the trench 107 and covering the first surface 103 of the substrate 101. A planarization process, such as chemical mechanical polishing, may be performed to remove excess filling material and provide a substantially flat surface for subsequent processing steps. The first insulating layer 401 filled in the trench 107 may be regarded as an embedding portion 407 of the first insulating segment 405.

The first insulating layer 401 may be formed of silicon nitride, silicon oxide, silicon oxynitride, flowable oxide, tonen silazen, undoped silica glass, borosilica glass, phosphosilica glass, borophosphosilica glass, plasma-enhanced tetra-ethyl orthosilicate, fluoride silicate glass, carbon-doped silicon oxide, xerogel, aerogel, amorphous fluorinated carbon, organo silicate glass, parylene, bis-benzocyclobutenes, polyimide, porous polymeric material, or a combination thereof, but is not limited thereto.

Figure 11:
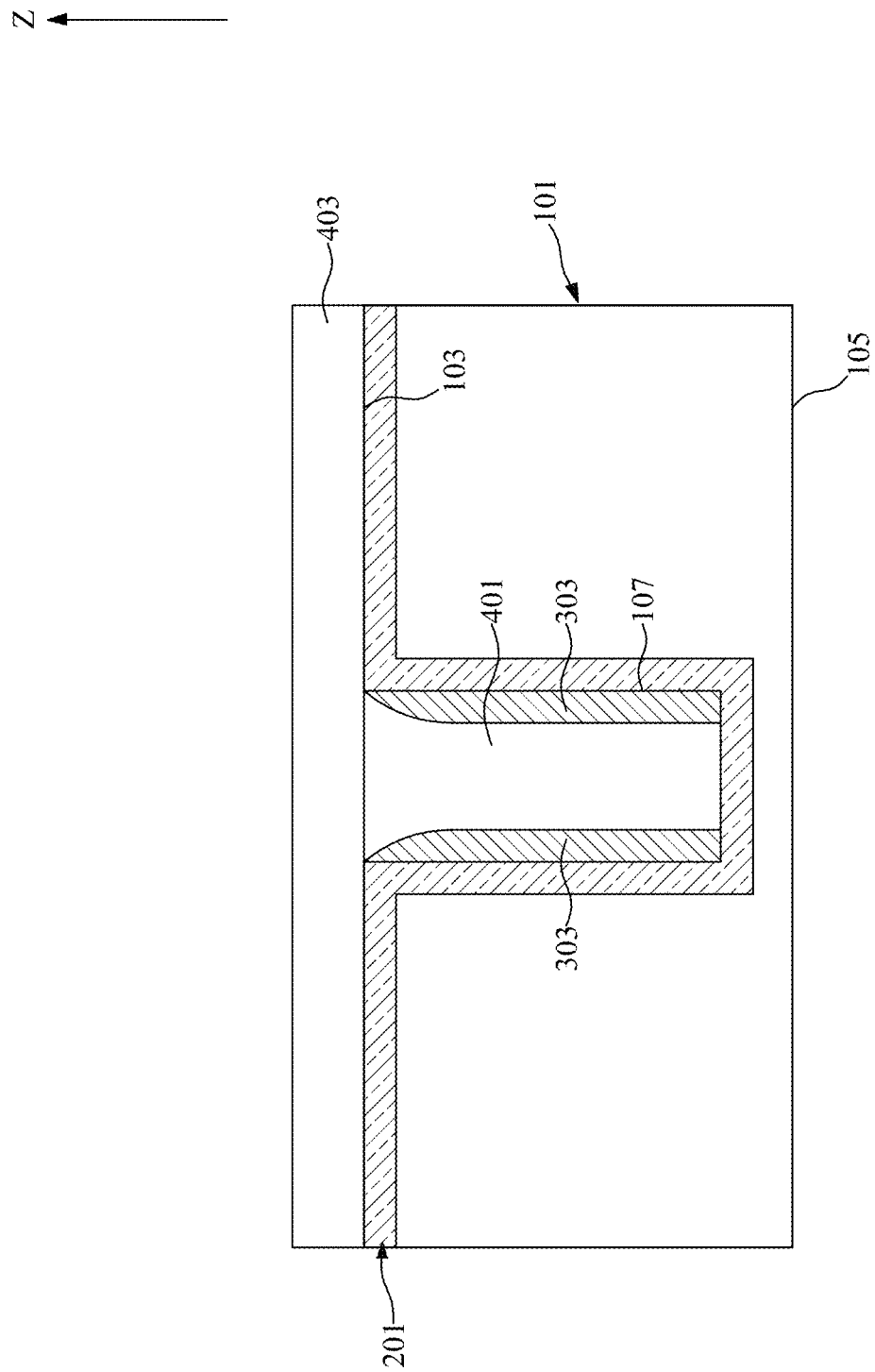
Figure 12:
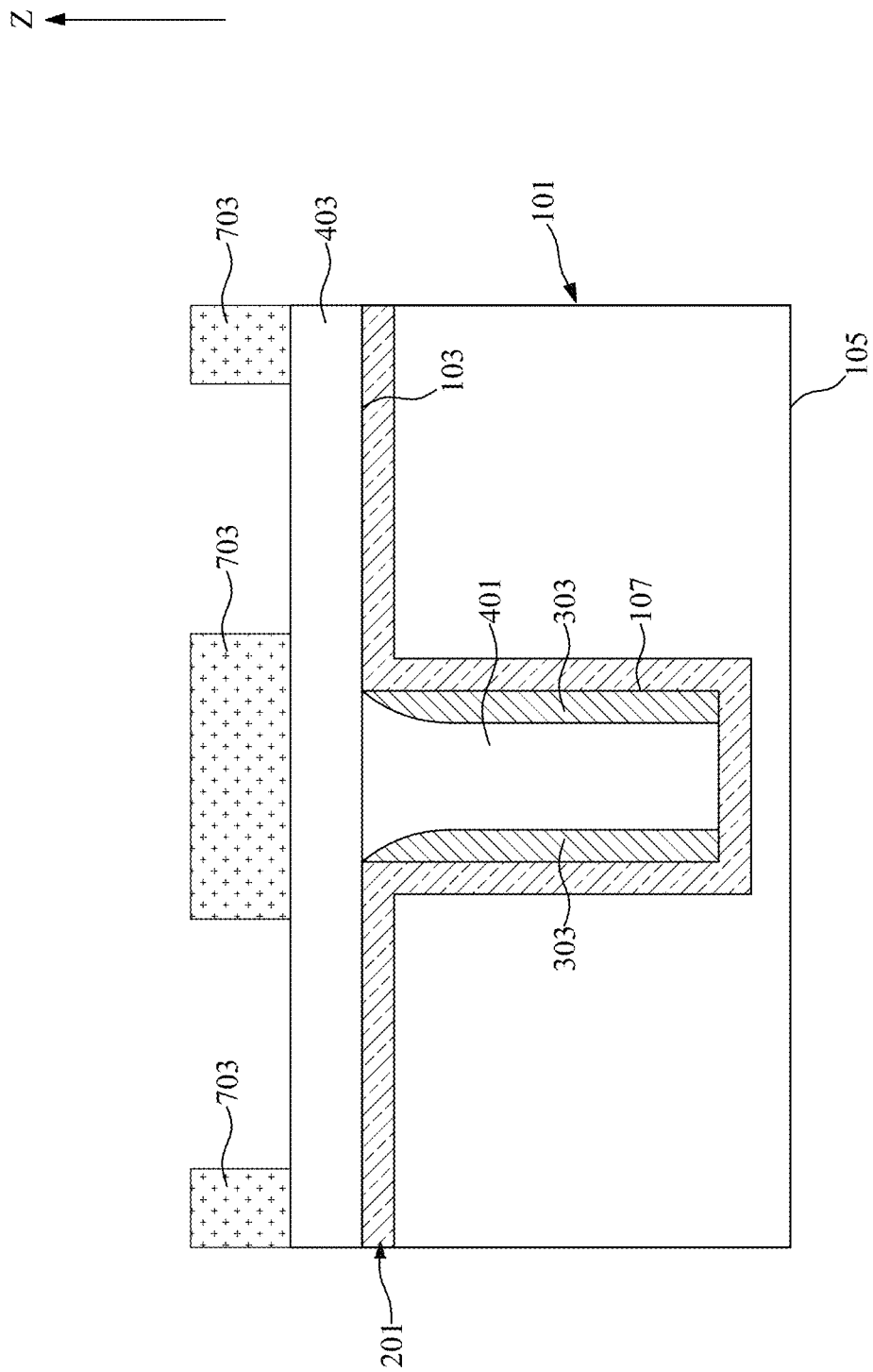
Figure 13:
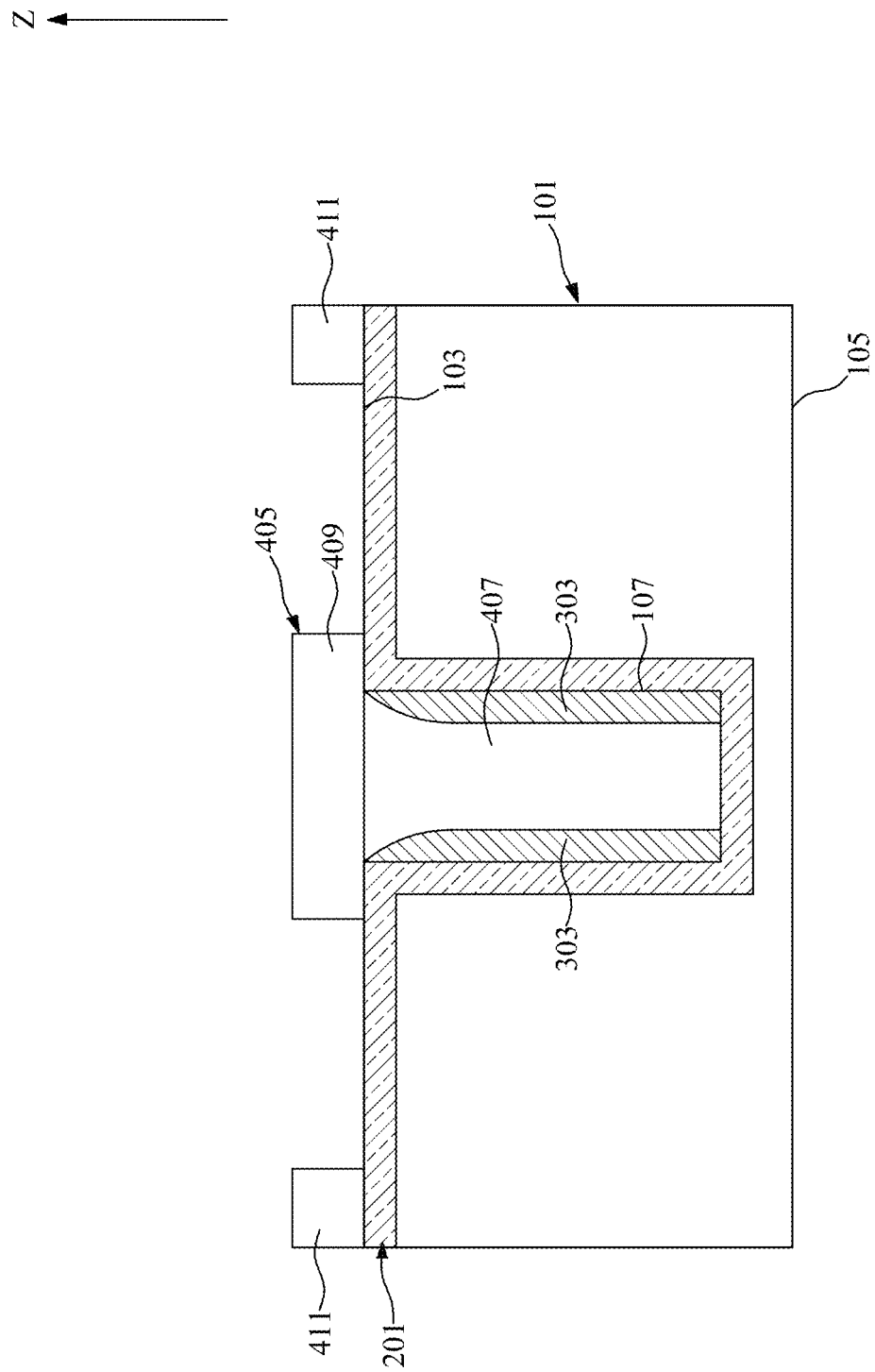

With reference to FIG. 11, a deposition process may be performed to deposit a second insulating layer 403 over the first surface 103 of the substrate 101. The second insulating layer 403 may be preferably formed of the same material as the material of the first insulating layer 401, but is not limited thereto. With reference to FIG. 12, a photolithography process may be performed by developing a second mask layer 703 on the second insulating layer 403 to define positions of an extension portion 409 of the first insulating segment 405 and the second insulating segments 411 on the second insulating layer 403. With reference to FIG. 13, an etch process, such as an anisotropic dry etch process, may be performed after the photolithography process to turn the second insulating layer 403 into the extension portion 409 of the first insulating segment 405 and the second insulating segments 411.

With reference to FIG. 3 and FIGS. 14 to 18, at step S21, in the embodiment depicted, a first conductive pad 507 and a second conductive pad 509 may be formed above the substrate 101. The first conductive pad 507 may include a first bottom conductive layer 511, a first middle conductive layer 513, and a first top conductive layer 515. The second conductive pad 509 may include a second bottom conductive layer 517, a second middle conductive layer 519, and a second top conductive layer 521.

Figure 14:
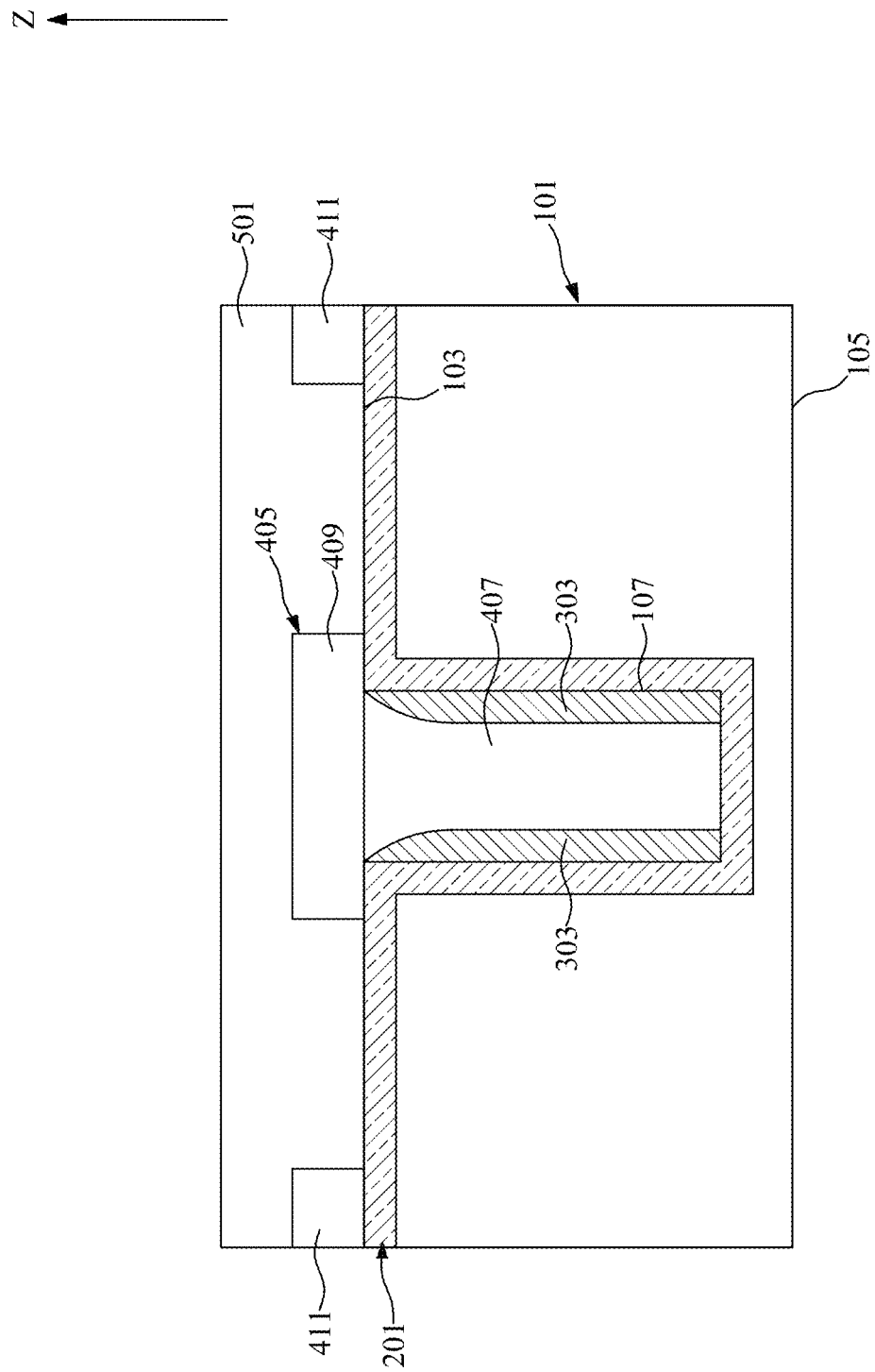
Figure 15:
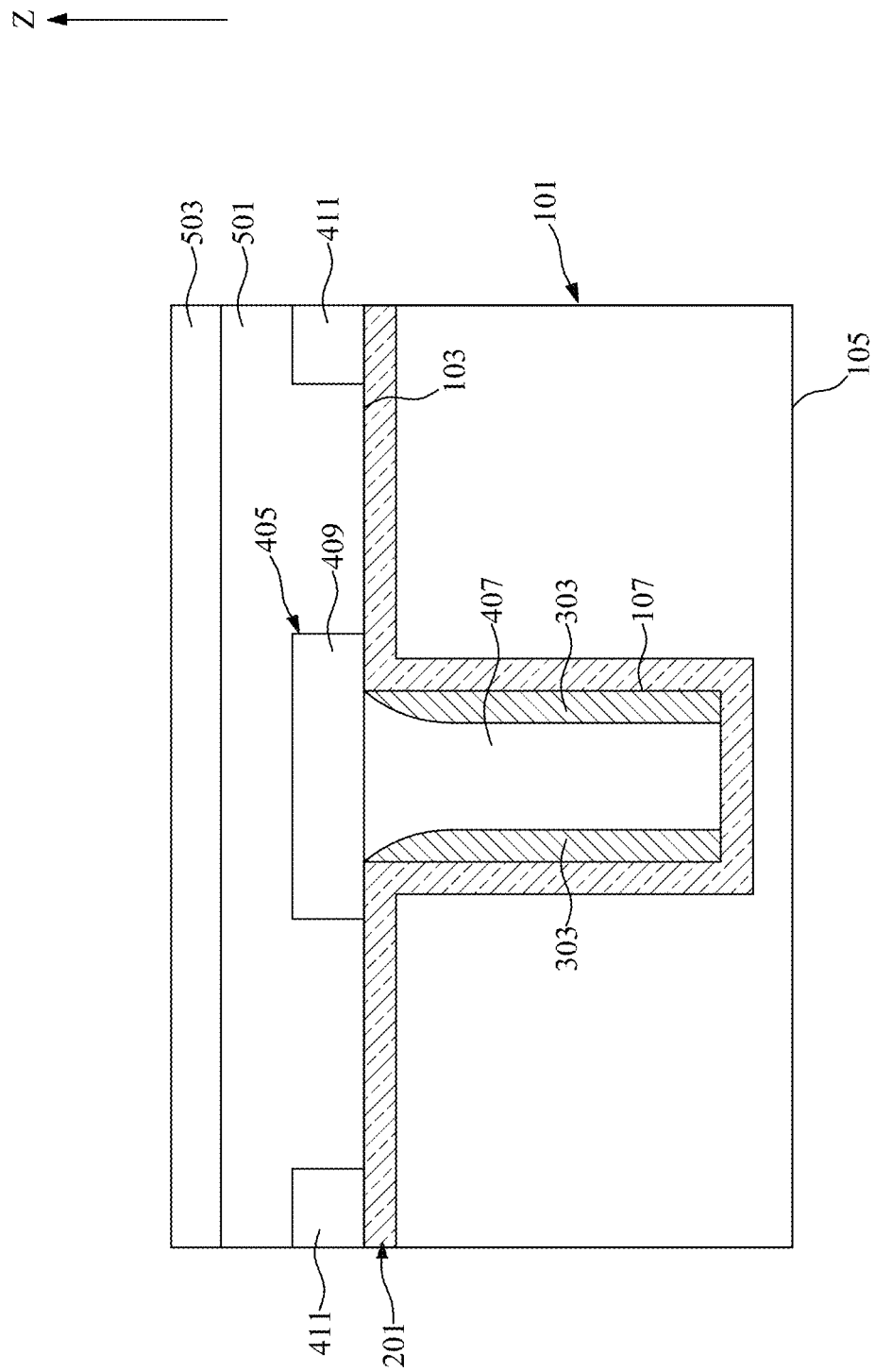
Figure 16:
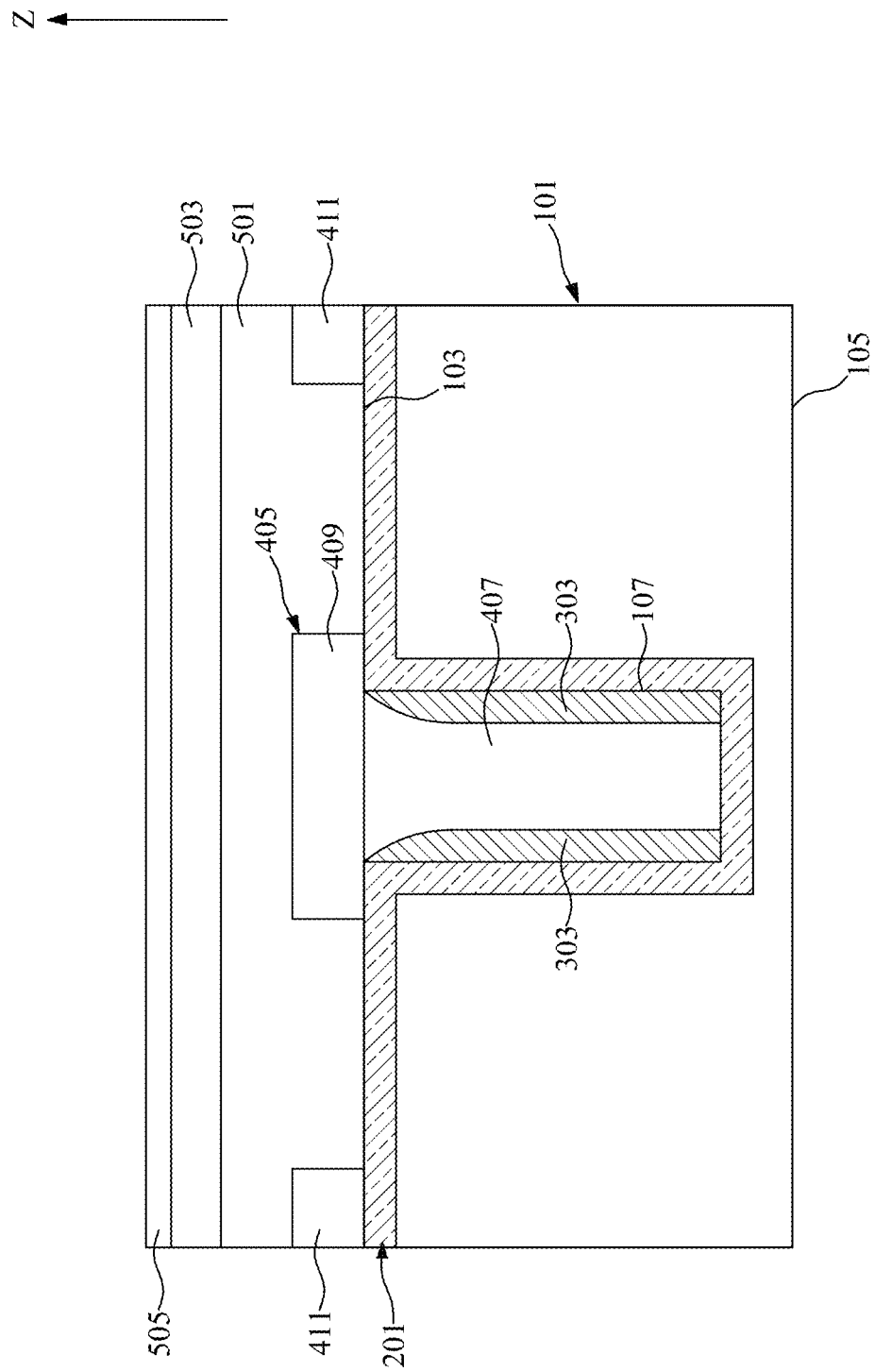

With reference to FIGS. 14 to 16, a series of deposition processes may be performed to deposit a first conductive layer 501, a second conductive layer 503, and a third conductive layer 505 above the substrate 101. The first conductive layer 501 may be formed on the first surface 103 of the substrate 101 and may cover the extension portion 409 and the second insulating segments 411. A planarization process, such as chemical mechanical polishing, may be performed to provide a substantially flat surface for subsequent processing steps. The second conductive layer 503 may be disposed on the first conductive layer 501. The third conductive layer 505 may be disposed on the second conductive layer 503. The first conductive layer 501, the second conductive layer 503, and the third conductive layer 505 may be formed of, for example, aluminum, silver, platinum, lead, nickel, gold, copper, alloys thereof, or the like.

Figure 17:
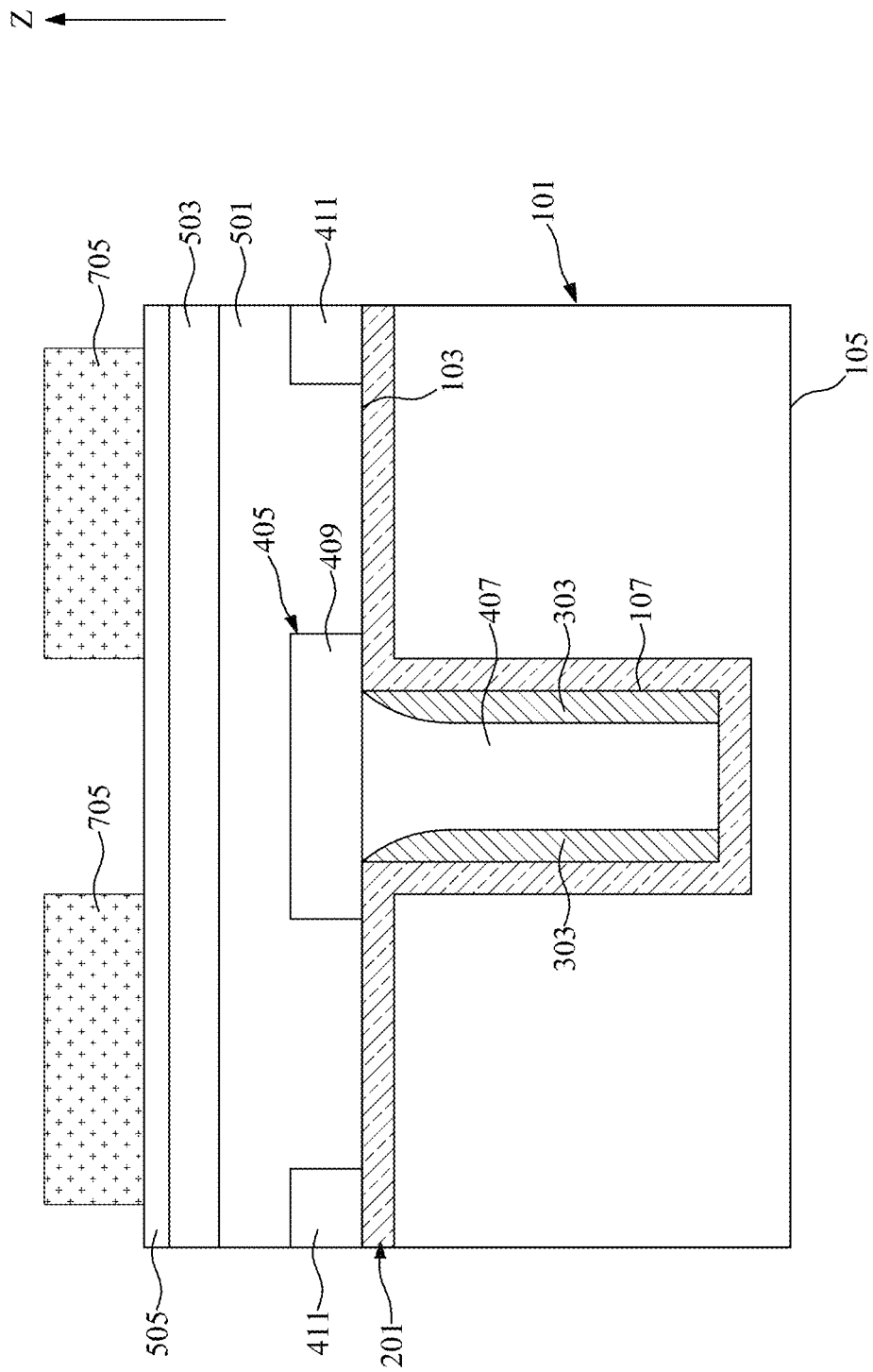
Figure 18:
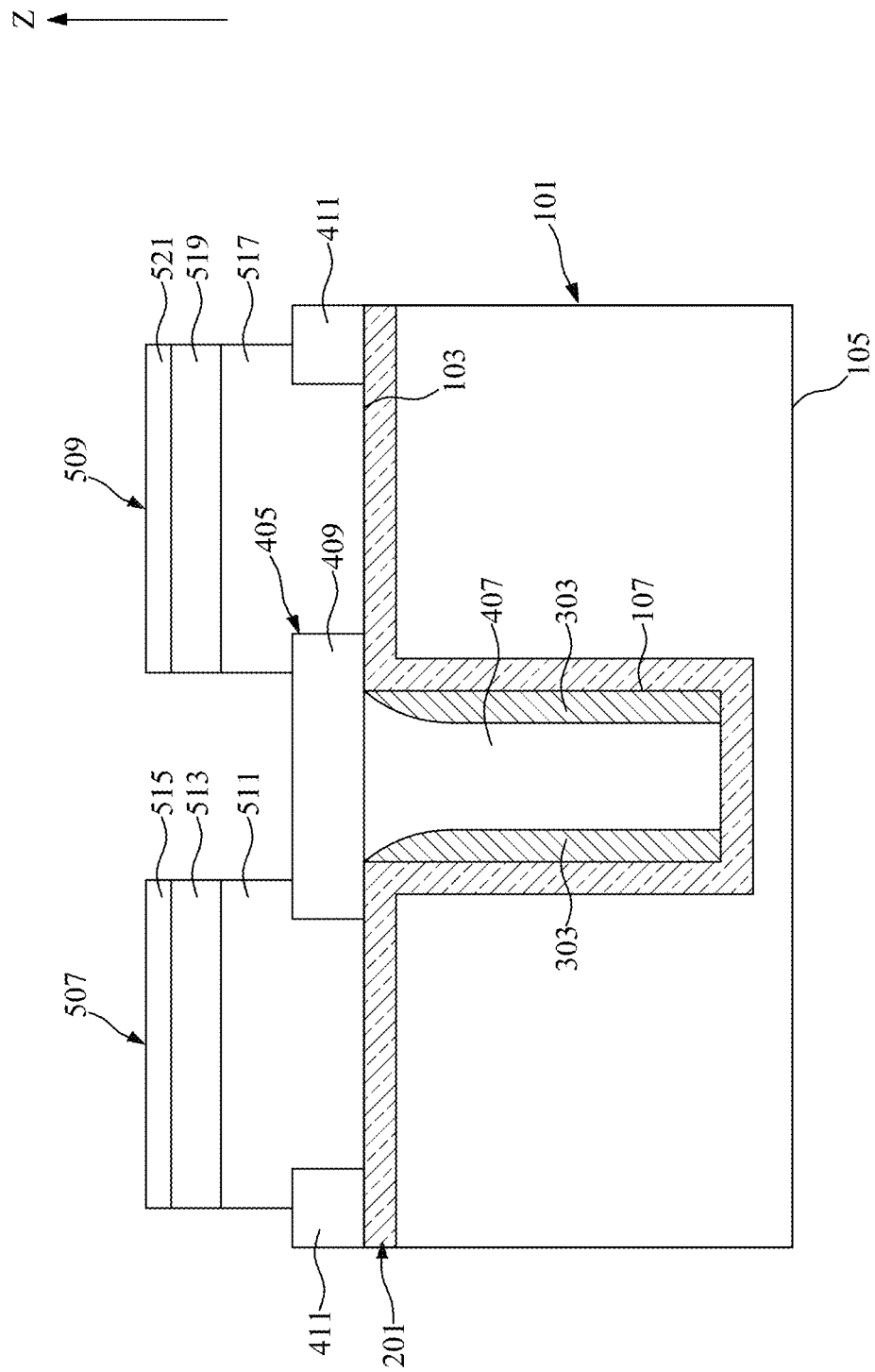

With reference to FIG. 17, a photolithography process may be performed by developing a third mask layer 705 on the third conductive layer 505 to define positions of the first conductive pad 507 and the second conductive pad 509 on the third conductive layer 505. With reference to FIG. 18, an etch process, such as an anisotropic dry etch process, may be performed after the photolithography process to turn the first conductive layer 501, the second conductive layer 503, and the third conductive layer 505 into the first conductive pad 507 and the second conductive pad 509.

Figure 19:
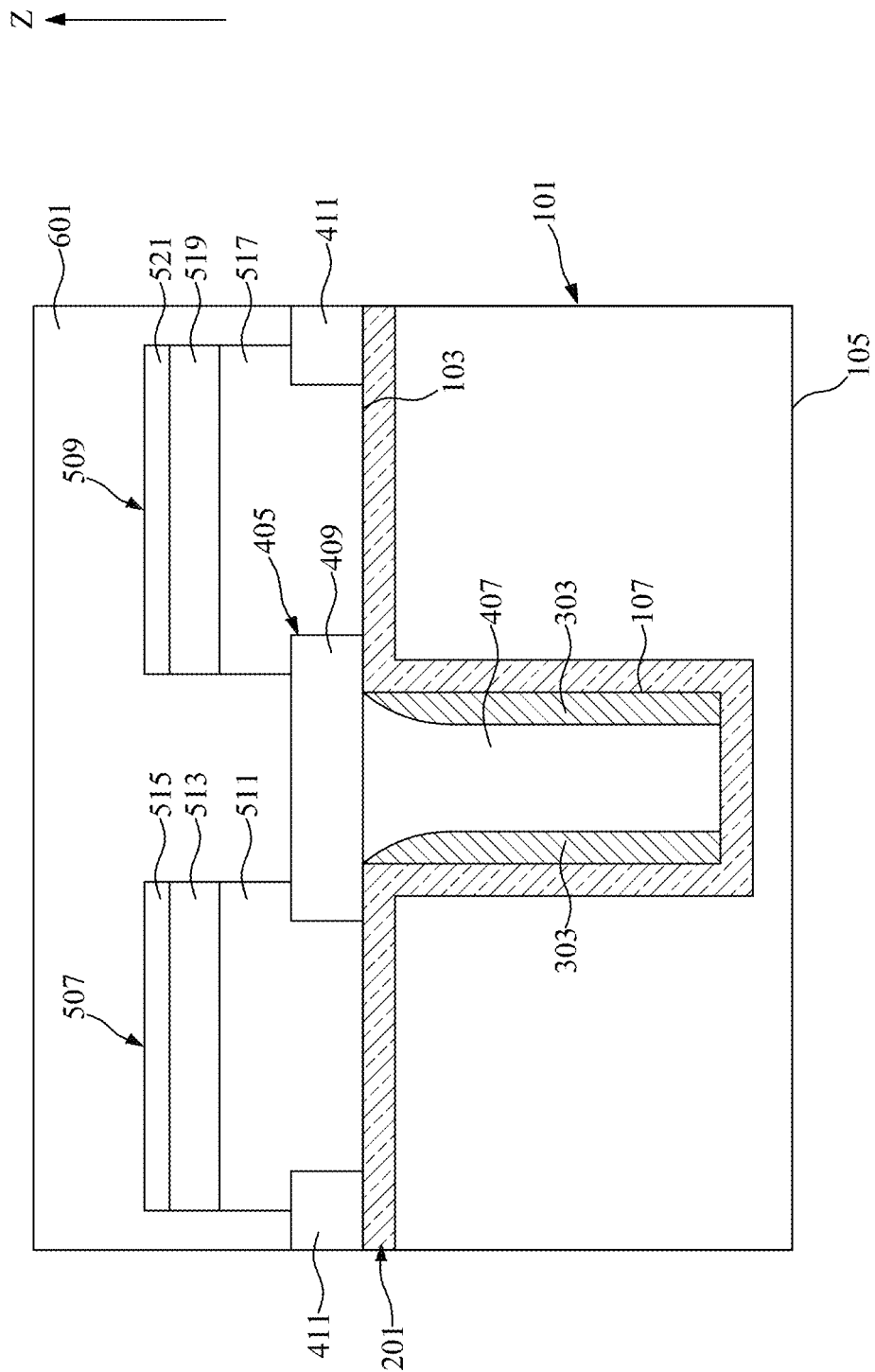
Figure 20:
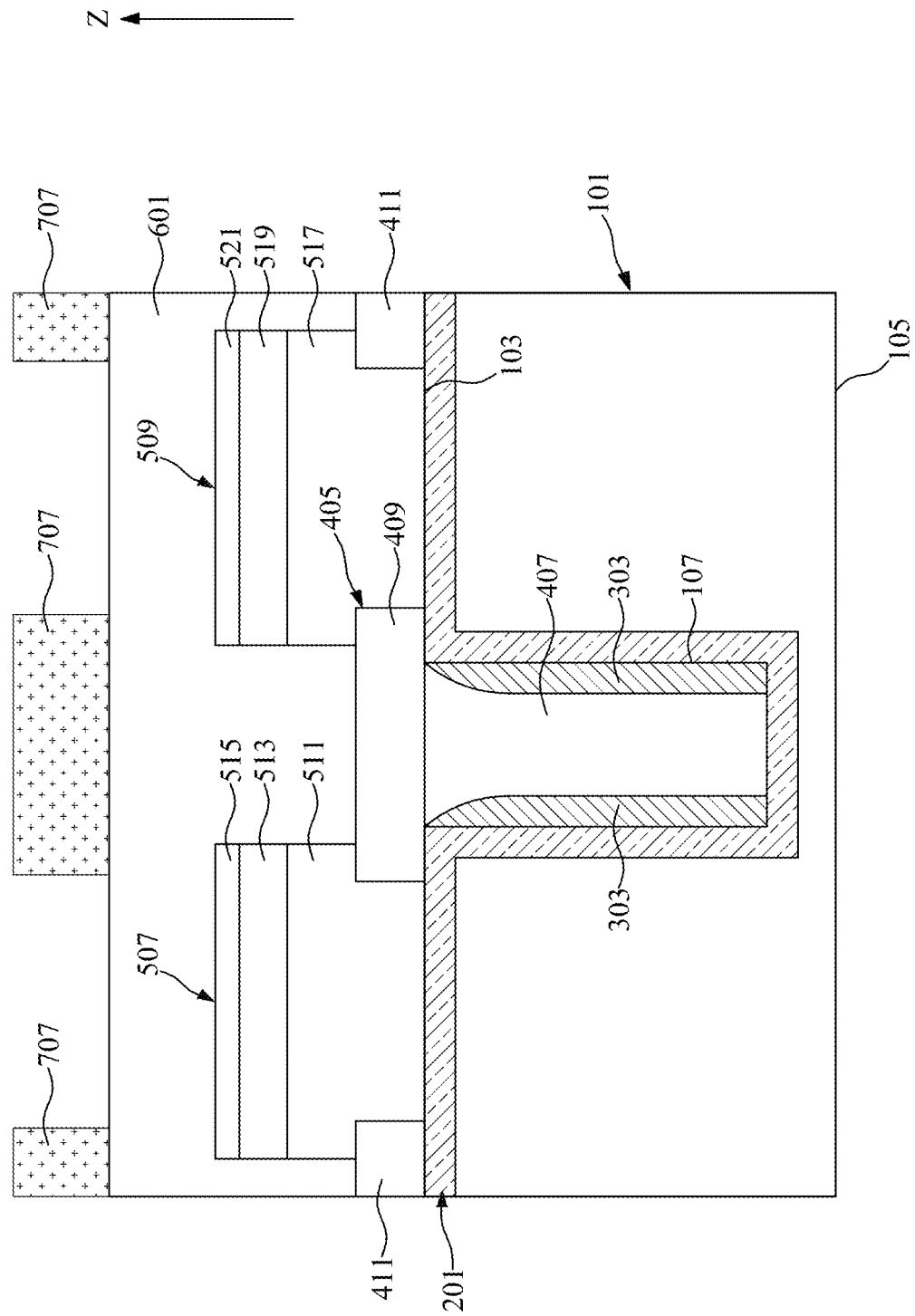
Figure 21:
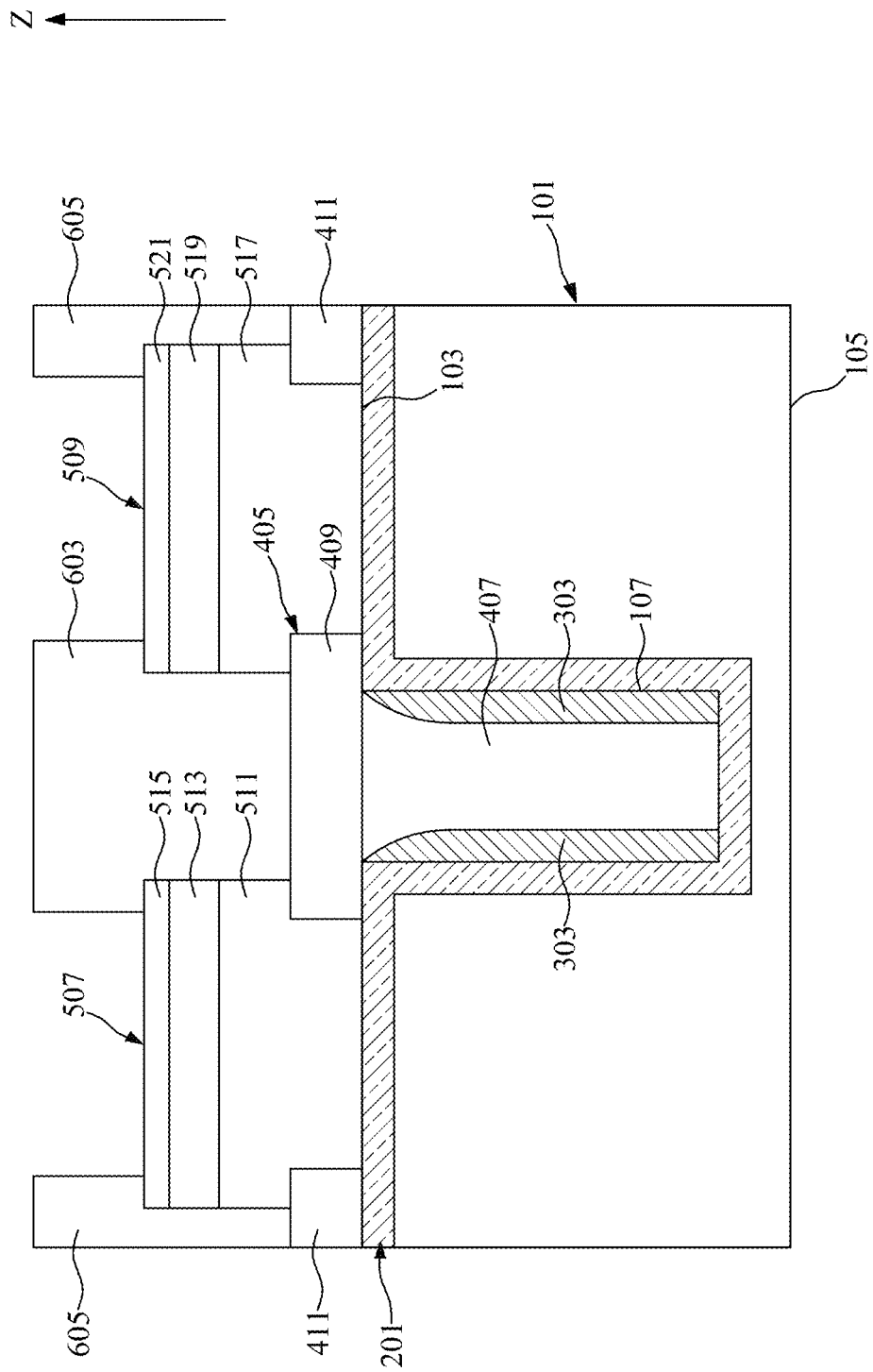

With reference to FIG. 3 and FIGS. 19 to 21, at step S23, a first passivation segment 603 and second passivation segments 605 may be formed above the substrate 101. With reference to FIG. 19, a deposition process may be performed to deposit a passivation layer 601 over the first conductive pad 507, the second conductive pad 509, the first insulating segment 405, and the second insulating segments 411. The passivation layer 601 may be formed of, for example, benzocyclobutene, polyimide, silicon oxide, silicon nitride, phosphosilica glass, or the like. With reference to FIG. 20, a photolithography process may be performed by developing a fourth mask layer 707 on the passivation layer 601 to define positions of the first passivation segment 603 and the second passivation segments 605 on the passivation layer 601. With reference to FIG. 21, an etch process, such as an anisotropic dry etch process, may be performed after the photolithography process to turn the passivation layer 601 into the first passivation segment 603 and the second passivation segments 605.

Figure 22:
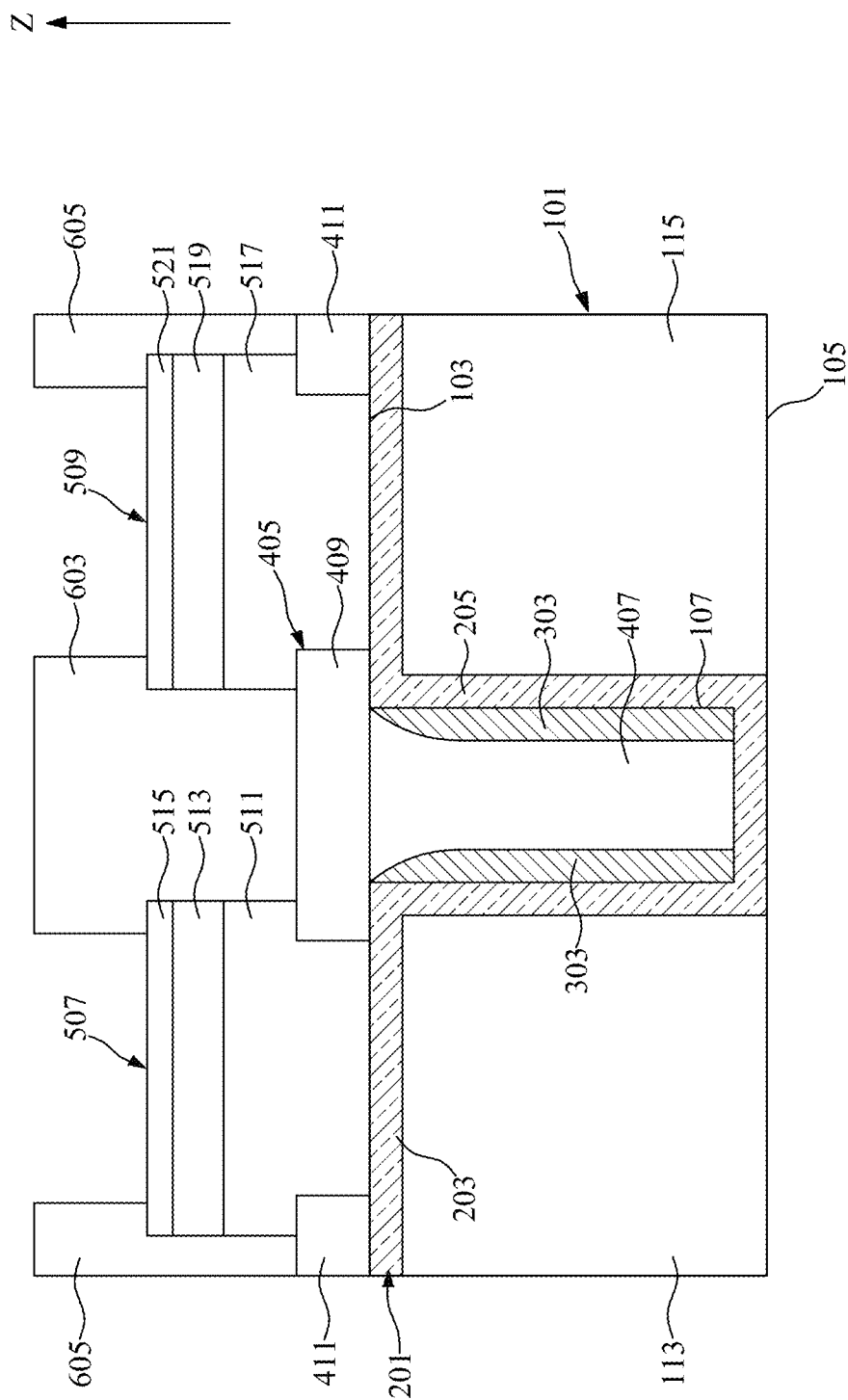

With reference to FIG. 3 and FIG. 22, at step S25, part of the substrate 101 may be removed from the second surface 105 until the plurality of liners 303 and the embedding portion 407 of the first insulating segment 405 are exposed. A removal process, such as chemical mechanical polishing, may be performed on the second surface 105 of the substrate 101 to expose the plurality of liners 303 and the embedding portion 407 of the first insulating segment 405 and turn the substrate 101 into a first conductive body 113 and the second conductive body 115.

One aspect of the present disclosure provides a semiconductor device including a first conductive body, a second conductive body positioned separate from the first conductive body, a plurality of liners respectively correspondingly attached to a side surface of the first conductive body and a side surface of the second conductive body, and a first insulating segment positioned between the first conductive body and the second conductive body.

Another aspect of the present disclosure provides a method for fabricating a semiconductor device including providing a substrate having a first surface and a second surface opposite to the first surface, inwardly forming a trench on the first surface of the substrate, forming a plurality of liners positioned on side surfaces of the trench, forming a first insulating segment filling the trench, and removing part of the substrate from the second surface to expose the first insulating segment and the plurality of liners.

Due to the design of the semiconductor device of the present disclosure, the equivalent series resistance and an equivalent series inductance of the semiconductor device may be reduced; thus, the performance of the semiconductor device may be improved.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, and steps.

What is claimed is:

1. A method for fabricating a semiconductor device, comprising:
    providing a substrate having a first surface and a second surface opposite to the first surface;
    inwardly forming a trench on the first surface of the substrate;
    forming a plurality of liners positioned on side surfaces of the trench;
    forming a first insulating segment filling the trench; and
    removing part of the substrate from the second surface to expose the first insulating segment and the plurality of liners.

2. The method for fabricating the semiconductor device of claim 1, further comprising forming a doped region in the substrate, wherein the doped region is positioned in the first surface of the substrate, the side surfaces of the trench, and a bottom of the trench.

3. The method for fabricating the semiconductor device of claim 2, wherein the plurality of liners are formed of titanium, titanium nitride, titanium-tungsten alloy, tantalum, tantalum nitride, or a combination thereof.

4. The method for fabricating the semiconductor device of claim 3, wherein the first insulating segment comprises an embedding portion and an extension portion, the embedding portion is positioned in the trench and covers the plurality of liners, and the extension portion is positioned on the embedding portion.

5. The method for fabricating the semiconductor device of claim 4, wherein the extension portion further cover a portion of the first surface of the substrate.

6. The method for fabricating the semiconductor device of claim 5, further comprising forming a first conductive pad and a second conductive pad above the substrate.

7. The method for fabricating the semiconductor device of claim 6, wherein the first conductive pad comprises a first bottom conductive layer positioned on the substrate, a first middle conductive layer positioned on the first bottom conductive layer, and a first top conductive layer positioned on the first middle conductive layer.

8. The method for fabricating the semiconductor device of claim 7, further comprising forming a first passivation segment positioned between the first conductive pad and the second conductive pad.

\* \* \* \* \*